(12) United States Patent
Zhang et al.

(10) Patent No.: US 12,322,341 B2
(45) Date of Patent: Jun. 3, 2025

(54) DISPLAY SUBSTRATE AND DISPLAY DEVICE

(71) Applicants: ORDOS YUANSHENG OPTOELECTRONICS CO., LTD., Ordos (CN); BOE TECHNOLOGY GROUP CO., LTD., Beijing (CN)

(72) Inventors: Qianqian Zhang, Beijing (CN); Liangliang Liu, Beijing (CN); Zhiyong Xue, Beijing (CN); Liman Peng, Beijing (CN); Yan Wu, Beijing (CN); Sihui Duan, Beijing (CN); Le Gao, Beijing (CN)

(73) Assignees: ORDOS YUANSHENG OPTOELECTRONICS CO., LTD., Ordos (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/618,111

(22) Filed: Mar. 27, 2024

(65) Prior Publication Data

US 2024/0233646 A1 Jul. 11, 2024

Related U.S. Application Data

(63) Continuation of application No. 18/039,342, filed as application No. PCT/CN2021/119360 on Sep. 18, 2021.

(51) Int. Cl.
*G09G 3/3233* (2016.01)
(52) U.S. Cl.
CPC ..... *G09G 3/3233* (2013.01); *G09G 2310/061* (2013.01); *G09G 2320/0233* (2013.01)
(58) Field of Classification Search
CPC ........... G09G 3/3233; G09G 2310/061; G09G 2320/0233
See application file for complete search history.

(56) References Cited

U.S. PATENT DOCUMENTS

| 10,872,945 B2 | 12/2020 | Choi |
| 11,133,357 B2 | 9/2021 | Zeng et al. |

(Continued)

FOREIGN PATENT DOCUMENTS

| CN | 102062982 A | 5/2011 |
| CN | 108364575 A | 8/2018 |

(Continued)

OTHER PUBLICATIONS

Notice of Allowance in U.S. Appl. No. 18/039,342 dated Apr. 3, 2024.
International Search Report in PCT/CN2021/119360 in Chinese dated Jun. 22, 2022 with English translation.

(Continued)

*Primary Examiner* — Jonathan A Boyd
(74) *Attorney, Agent, or Firm* — Collard & Roe, P.C.; William Collard

(57) ABSTRACT

A display substrate and a display device are disclosed. The display substrate includes a base substrate and a plurality of sub-pixels located thereon. Each sub-pixel includes a pixel circuit and a pixel electrode electrically connected thereto, and each pixel circuit includes a driving sub-circuit. The pixel electrode includes a main electrode part and a first electrode extension part extending therefrom. The display substrate includes first type of sub-pixels. The main electrode part of each sub-pixel of the first type of sub-pixels is not overlapped with a control electrode of the driving sub-circuit of the sub-pixel or an electrode part directly electrically connected to the control electrode, and the first electrode extension part of each pixel electrode is at least partially overlapped with the control electrode or the electrode part. The first type of sub-pixels include at least two sub-pixels configured to emit light of different colors.

16 Claims, 13 Drawing Sheets

(56) References Cited

U.S. PATENT DOCUMENTS

| | | | |
|---|---|---|---|
| 11,271,183 | B2 | 3/2022 | Zeng et al. |
| 11,552,131 | B2 | 1/2023 | Huang et al. |
| 11,930,681 | B2 | 3/2024 | Wang et al. |
| 11,875,746 | B2 | 6/2024 | Cho et al. |
| 2019/0279563 | A1* | 9/2019 | Hwang ................ G09G 3/3225 |
| 2020/0013337 | A1 | 1/2020 | Cho et al. |
| 2020/0343320 | A1 | 10/2020 | Zeng et al. |
| 2020/0343477 | A1 | 10/2020 | Zeng et al. |
| 2021/0134892 | A1* | 5/2021 | Hwang ................ G09G 3/3275 |
| 2021/0210563 | A1 | 7/2021 | Huang et al. |
| 2021/0225228 | A1 | 7/2021 | Zhou |
| 2021/0359075 | A1 | 11/2021 | Liu et al. |
| 2021/0366947 | A1* | 11/2021 | Li ..................... G02F 1/134309 |
| 2022/0293579 | A1 | 9/2022 | Ogawa et al. |

FOREIGN PATENT DOCUMENTS

| | | |
|---|---|---|
| CN | 110046611 A | 7/2019 |
| CN | 110061042 A | 7/2019 |
| CN | 110706647 A | 1/2020 |
| CN | 111799320 A | 10/2020 |
| CN | 112864201 A | 5/2021 |
| WO | 2021016956 A1 | 2/2021 |
| WO | 2021097754 A1 | 5/2021 |
| WO | 2021111783 A1 | 6/2021 |

OTHER PUBLICATIONS

Written Opinion of the International Search Authority in PCT/CN2021/119360 in Chinese dated Jun. 22, 2022 with English translation.

* cited by examiner

DISPLAY SUBSTRATE AND DISPLAY DEVICE

CROSS-REFERENCE TO RELATED APPLICATION(S)

This application is a continuation of U.S. patent application Ser. No. 18/039,342, filed on May 30, 2023 which is a national phase of PCT Application No. PCT/CN2021/119360, filed on Sep. 18, 2021.

TECHNICAL FIELD

Embodiments of the present disclosure relate to a display substrate and a display device.

BACKGROUND

Organic Light-Emitting Diode (OLED) displays have many advantages, such as active light emission, high contrast ratio, fast response speed, small thickness and weight, and become one of the major new generation of displays. With the rapid development of high-resolution products, higher requirements have been put forward for structural designs of display substrates of the displays, such as an arrangement of pixels and signal lines.

SUMMARY

At least one embodiment of the present disclosure provides a display substrate, including: a base substrate; and a plurality of sub-pixels, distributed in an array on the base substrate. Each of the plurality of sub-pixels includes a pixel circuit, the pixel circuit is configured to drive a light-emitting element corresponding to each of the plurality of sub-pixels, the plurality of sub-pixels are arranged in a plurality of pixel rows along a first direction and a plurality of pixel columns along a second direction, and the first direction is different from the second direction; each pixel circuit includes a driving sub-circuit, the driving sub-circuit includes a control electrode, and the driving sub-circuit is configured to control a driving current for driving the corresponding light-emitting element according to a voltage on the control electrode; each of the plurality of sub-pixels further includes a pixel electrode which is electrically connected with the pixel circuit; for each of the plurality of sub-pixels, the pixel electrode includes an main electrode part and a first electrode extension part extending from the main electrode part, the main electrode part is configured to drive an organic functional layer of the light-emitting element corresponding to the sub-pixel to emit light, the first electrode extension part is electrically connected with the pixel circuit of the sub-pixel through a first via hole; the plurality of sub-pixels include first type of sub-pixels, and for each sub-pixel in the first type of sub-pixels, in a direction perpendicular to the base substrate, the main electrode part of the pixel electrode of the each sub-pixel is not overlapped with the control electrode of the driving sub-circuit of the pixel circuit of the each sub-pixel or is not overlapped with an electrode part directly electrically connected with the control electrode, and the first electrode extension part of the pixel electrode of the each sub-pixel is at least partially overlapped with the control electrode of the driving sub-circuit of the pixel circuit of the each sub-pixel or at least partially overlapped with the electrode part; and the first type of sub-pixels at least include two sub-pixels configured to emit light of different colors.

In some examples, the first type of sub-pixels include three sub-pixels configured to emit light of different colors, and the three sub-pixels are respectively configured to emit green light, red light and blue light.

In some examples, the sub-pixels configured to emit light of a same color have pixel electrodes of at least two different shapes.

In some examples, in the direction perpendicular to the base substrate, the main electrode part of the pixel electrode of each sub-pixel in the first type of sub-pixels is not overlapped with the control electrode of the driving sub-circuit of the pixel circuit of the each sub-pixel, and the first electrode extension part of the pixel electrode of the each sub-pixel is at least partially overlapped with the control electrode of the driving sub-circuit of the pixel circuit of the each sub-pixel.

In some examples, an orthographic projection of the first via hole in each sub-pixel in the first type of sub-pixels on the base substrate is located, in the second direction, between an orthographic projection of the main electrode part of the pixel electrode of the each sub-pixel on the base substrate and an orthographic projection of the control electrode of the driving sub-circuit of the pixel circuit of the each sub-pixel on the base substrate.

In some examples, for at least one sub-pixel in the first type of sub-pixels, the orthographic projection of the first via hole on the base substrate divides an orthographic projection of the at least one sub-pixel on the base substrate into a first projection part and a second projection part which are arranged along the second direction; the first projection part is at least partially overlapped with the orthographic projection of the control electrode of the driving sub-circuit of the pixel circuit of the each sub-pixel on the base substrate or an orthographic projection of the electrode part directly electrically connected with the control electrode on the base substrate; and in the second direction, a ratio of a size of the second projection part to a size of the first projection part is from 0.7 to 1.5.

In some examples, the plurality of sub-pixels further include second type of sub-pixels, and for each sub-pixel in the second type of sub-pixels; in the direction perpendicular to the base substrate, the main electrode part of the pixel electrode of the each sub-pixel is at least partially overlapped with the control electrode of the driving sub-circuit of the pixel circuit of the each sub-pixel.

In some examples, one of two sub-pixels adjacent in the first direction belongs to the first type of sub-pixels, and the other one belongs to the second type of sub-pixels.

In some examples, the main electrode parts of the pixel electrodes of the plurality of sub-pixels are arranged in a plurality of pixel electrode rows along the first direction and a plurality of pixel electrode columns along the second direction; the plurality of pixel electrode rows include first pixel electrode rows and second pixel electrode rows that are adjacent, the sub-pixels including the main electrode parts in the first pixel electrode rows belong to the first type of sub-pixels, and the sub-pixels including the main electrode parts in the second pixel electrode rows belong to the second type of sub-pixels.

In some examples, in the second direction, the first via hole of the sub-pixel including each of a plurality of main electrode parts in the first pixel electrode row is located at a side of the each of the plurality of pixel main electrode parts close to the second pixel electrode row, and the first via hole of the sub-pixel including each of a plurality of main electrode parts in the second pixel electrode row is located at a side of the each of the plurality of pixel main electrode parts close to the first pixel electrode row.

In some examples, the plurality of sub-pixels include a first sub-pixel, a second sub-pixel and a third sub-pixel that are adjacent in the first direction; the third sub-pixel and the second sub-pixel are respectively located at two sides of the first sub-pixel; the first sub-pixel, the second sub-pixel and the third sub-pixel constitute a first pixel group, and the first pixel group is configured to emit full-color light; and the first sub-pixel is one of the first type of sub-pixels.

In some examples, in the direction perpendicular to the base substrate, the pixel electrode of one third sub-pixel is at least partially overlapped with the control electrode of the driving sub-circuit of the pixel circuit of one first sub-pixel and the control electrode of the driving sub-circuit of the pixel circuit of one third sub-pixel, respectively.

In some examples, main electrode parts of pixel electrodes of the first sub-pixel, the second sub-pixel and the third sub-pixel are distributed in a first triangular shape.

In some examples, in the first direction, the first electrode extension part of the pixel electrode of the first sub-pixel is located between the main electrode part of the pixel electrode of the second sub-pixel and the main electrode part of the pixel electrode of the third sub-pixel.

In some examples, the pixel electrode of the second sub-pixel further includes a second electrode extension part extending from the main electrode part; and in the direction perpendicular to the base substrate, the second electrode extension part of the second sub-pixel is at least partially overlapped with the control electrode of the driving sub-circuit of the fourth sub-pixel; and the fourth sub-pixel and the first sub-pixel are respectively located at two sides of the second sub-pixel along the first direction.

In some examples, the pixel circuit further includes a compensation sub-circuit, the compensation sub-circuit includes a first control electrode and a second control electrode, the first control electrode and the second control electrode are configured to receive scanning signals; and the compensation sub-circuit is connected with the driving sub-circuit, and is configured to perform threshold compensation on the driving sub-circuit in response to the scanning signals.

In some examples, the pixel electrode of the first sub-pixel further includes a second electrode extension part extending from the main electrode part; and in the direction perpendicular to the base substrate, the second electrode extension part of the first sub-pixel is at least partially overlapped with the first control electrode and the second control electrode of the compensation sub-circuit of a fifth sub-pixel, respectively, and the fifth sub-pixel is adjacent to the first sub-pixel in the second direction.

In some examples, the pixel electrode of the second sub-pixel further includes a third electrode extension part extending from the main electrode part; and in the direction perpendicular to the base substrate, the third electrode extension part of the second sub-pixel is at least partially overlapped with the first control electrode and the second control electrode of the compensation sub-circuit of the pixel electrode of the second sub-pixel, respectively.

In some examples, the pixel circuit further includes a first reset sub-circuit, the first reset sub-circuit includes a first control electrode and a second control electrode, the first control electrode and the second control electrode of the first reset sub-circuit are configured to receive a first reset control voltage, the first reset sub-circuit is connected with the pixel electrode of the light-emitting element and is configured to reset the pixel electrode of the light-emitting element in response to the first reset control voltage.

In some examples, in the direction perpendicular to the base substrate, the pixel electrode of the first sub-pixel is at least partially overlapped with the first control electrode and the second control electrode of the first reset sub-circuit of the first sub-pixel, respectively.

In some examples, the pixel electrode of the first sub-pixel further includes a third electrode extension part extending from the main electrode part; and in the direction perpendicular to the base substrate, the third electrode extension part of the pixel electrode of the first sub-pixel is at least partially overlapped with at least one of the first control electrode and the second control electrode of the first reset sub-circuit of the second sub-pixel.

In some examples, the plurality of sub-pixels further include a sixth sub-pixel, a seventh sub-pixel and an eighth sub-pixel that are adjacent in the first direction, the sixth sub-pixel, the seventh sub-pixel and the eighth sub-pixel constitute a second pixel group, and the second pixel group is configured to emit full-color light; and the main electrode parts of the pixel electrodes of all of the sixth sub-pixel, the seventh sub-pixel and the eighth sub-pixel are distributed in a second triangular shape, and the second triangular shape and the first triangular shape are inverted to each other.

In some examples, the main electrode parts of the pixel electrodes of the sub-pixels of a same color in the first pixel group and in the second pixel group are not overlapped in the second direction.

In some examples, the pixel electrode of the sub-pixel in the first pixel group is overlapped with the pixel electrode of the sub-pixel in the second pixel group in the second direction.

At least one embodiment of the present disclosure further provides a display device, including the display substrate described in any of the embodiments above.

BRIEF DESCRIPTION OF DRAWINGS

In order to clearly illustrate the technical solution of the embodiments of the present disclosure, the drawings of the embodiments will be briefly described. It is apparent that the described drawings are only related to some embodiments of the present disclosure and thus are not limitative of the present disclosure.

DETAILED DESCRIPTION

In order to make objects, technical details and advantages of embodiments of the present disclosure clear, the technical solutions of the embodiments will be described in a clearly and fully understandable way in connection with the related drawings. It is apparent that the described embodiments are just a part but not all of the embodiments of the present disclosure. Based on the described embodiments herein, those skilled in the art can obtain, without any inventive work, other embodiment(s) which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects listed after these terms as well as equivalents thereof, but do not exclude other elements or objects. The phrases "connect", "connected", etc., are not intended to define a physical connection or a mechanical connection, but may comprise an electrical connection which is direct or indirect. The terms "on," "under," "right," "left" and the like are only used to indicate relative position relationship, and in a case that the position of an object is described as being changed, the relative position relationship may be changed accordingly.

At present, there are two methods to extend the service life of AMOLED. One is to upgrade materials to improve a luminous efficiency of luminescent materials; the other is to increase an aperture ratio of pixels. In order to increase the aperture ratio of pixels, it is necessary to optimize an arrangement mode of the pixels, for example, Delta-type RGB arrangement, that is, R sub-pixel, G sub-pixel, and B sub-pixel are arranged in a triangular shape, which is an arrangement with a highest aperture ratio in existing arrangements. The Delta-type pixel arrangement is characterized by that, pixel electrodes (that is, an electrode of a light-emitting element, for example, the electrode can be a cathode or an anode) of the R sub-pixel, the G sub-pixel and the B sub-pixel in each of the pixel units are arranged in a triangular shape, and pixel electrodes of sub-pixels emitting light with a same color in adjacent pixel units are vertically rotated by 180°.

Figure 1:
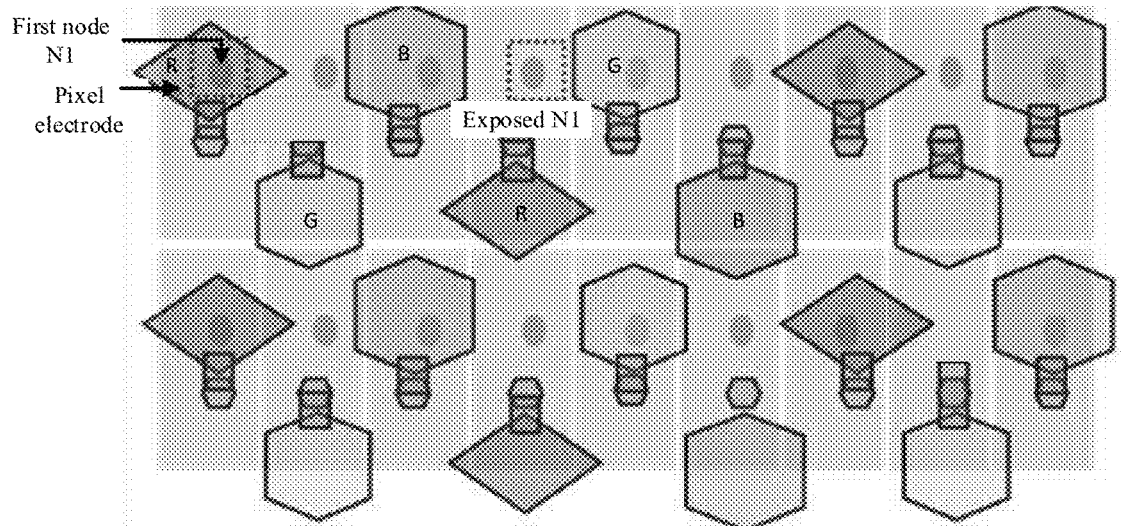
FIG. 1 is a schematic diagram of a display substrate.

FIG. 1 shows a schematic diagram of a Delta-type pixel arrangement, as shown in FIG. 1, in each of the pixel units, sub-pixels of three colors (RGB) are arranged in a triangular shape; in pixel units adjacent in a row direction, pixel electrodes of sub-pixels emitting light with a same color are rotated by 180° vertically with respect to the row direction, so that positions of the pixel electrodes of the sub-pixels relative to the pixel circuits are inconsistent. For example, the pixel circuits of respective sub-pixels are arranged repeatedly, thus the same circuit nodes in the pixel circuits of respective sub-pixels have the same positions. FIG. 1 schematically shows a first node N1 connected with a control terminal of a driving sub-circuit in the pixel circuit of each of the sub-pixels, by using round dots.

The inventor(s) found that the variation of the positions of the pixel electrodes leads to non-uniformity of parasitic capacitance of respective sub-pixels. For example, as shown in FIG. 1, in the sub-pixel in the odd-numbered column, the pixel electrode covers the first node N1, that is, the parasitic capacitance is generated between the pixel electrode and the first node; in the sub-pixel in the even-numbered column, the pixel electrode is not overlapped with the first node N1 in the direction perpendicular to the base substrate, so that there is no parasitic capacitance generated between the pixel electrode and the first node. According to a working principle of the pixel circuit, a potential of the control terminal (that is, the node N1) of the driving sub-pixel directly affects a magnitude of the driving current, and hence affects a luminous brightness of the sub-pixel. Therefore, an uneven distribution of the above-mentioned parasitic capacitance causes fluctuations in the luminous brightness of the sub-pixel, and finally results in uneven display image.

At least one embodiment of the present disclosure provides a display substrate, which includes a base substrate and a plurality of sub-pixels distributed on the base substrate in an array. Each of the plurality of sub-pixels includes a pixel circuit, the pixel circuit is configured to drive a light-emitting element corresponding to each of the plurality of sub-pixels, the plurality of sub-pixels are arranged in a plurality of pixel rows along a first direction and a plurality of pixel columns along a second direction, and the first direction and the second direction are different; each of the pixel circuits includes a driving sub-circuit, the driving sub-circuit includes a control electrode, the driving sub-circuit is configured to control a driving current for driving the corresponding light-emitting element according to a voltage on the control electrode; each of the plurality of sub-pixels further includes a pixel electrode, the pixel electrode of each of the sub-pixels and the pixel circuit are electrically connected with each other; for each of the sub-pixels, the pixel electrode includes an main electrode part and a first electrode extension part extending from the main electrode part, the main electrode part is configured to drive an organic functional layer of the light-emitting element corresponding to the sub-pixel to emit light, and the first electrode extension part is electrically connected with the pixel circuit of the sub-pixel through a first via hole; the plurality of sub-pixels include first type of sub-pixels, for each sub-pixel in the first type of sub-pixels, in a direction perpendicular to the base substrate, the main electrode part of the pixel electrode of the each sub-pixel is not overlapped with the control electrode of the driving sub-circuit of the pixel circuit of the each sub-pixel or the electrode part directly electrically connected with the control electrode, and the first electrode extension part of the pixel electrode of the each sub-pixel is at least partially overlapped with the control electrode of the driving sub-circuit of the pixel circuit of the each sub-pixel or the electrode part, and the first type of sub-pixels at least include two sub-pixels configured to emit light of different colors.

For example, the electrode part and the control electrode may be electrically connected by connection methods such as overlapping, adjoining, or connecting through a via hole.

In the display substrate provided by at least one embodiment of the present disclosure, an extension part of the pixel electrode of a first type of sub-pixel is arranged to be overlapped with the control electrode of the driving sub-circuit or the electrode part (that is, the first node N1) electrically connected with the control electrode, and at least two sub-pixels emitting light with different colors are set as the first type of sub-pixels, so that a difference in parasitic capacitance between respective sub-pixels can be reduced or eliminated, thereby improving display uniformity.

Figure 2:
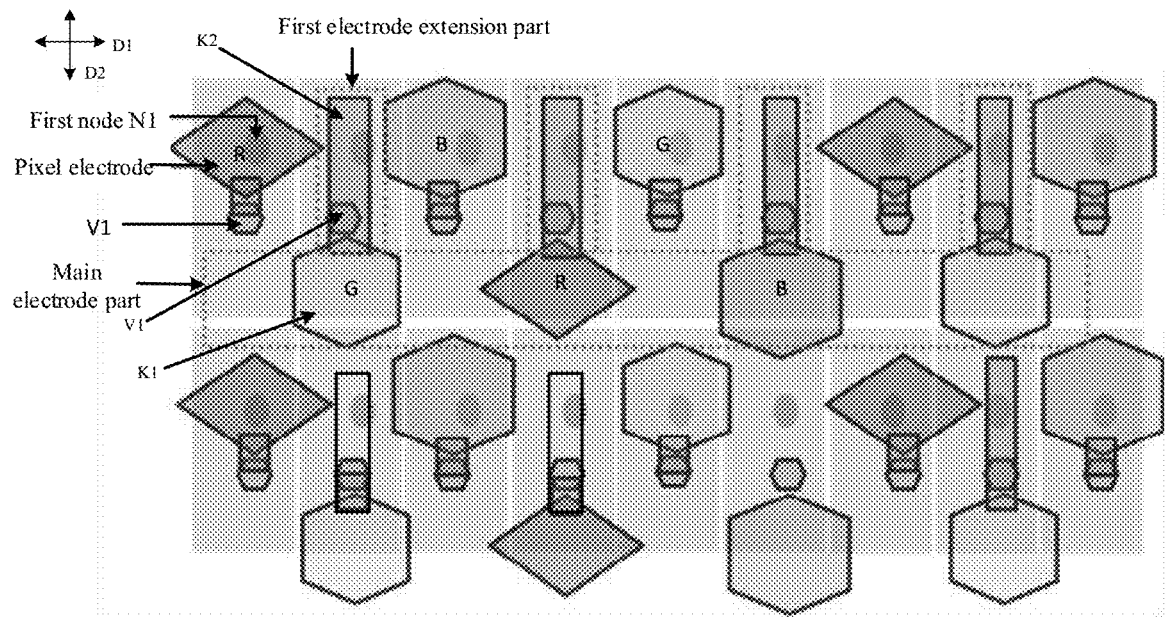
FIG. 2 is a first schematic diagram of a display substrate provided by at least one embodiment of the present disclosure.

FIG. 2 is a plan view of a display substrate provided by at least one embodiment of the present disclosure, the plurality of sub-pixels in the display substrate are arranged on the base substrate as a plurality of pixel rows along the first direction D1 and a plurality of pixel columns along the second direction D2, and the first direction D1 is intersected with the second direction D2, for example, the first direction D1 is perpendicular to the second direction D2. For the sake of clarity, only a pixel arrangement of two rows and nine columns of sub-pixels of the display substrate is shown in FIG. 2. Compared with the pixel arrangement shown in FIG. 1, in the pixel arrangement shown in FIG. 2, both of the pixel electrode of the sub-pixel in the odd-numbered column and the pixel electrode of the sub-pixel in the even-numbered column cover the first node N1, that is, the parasitic capacitance is generated between the pixel electrode and the first node for all of the sub-pixels; and the pixel electrode of the sub-pixel in the even-numbered column covers the first node N1 by the first electrode extension part of the pixel electrode.

The plurality of sub-pixels include first type of sub-pixels; for each sub-pixel in the first type of sub-pixels, in the direction perpendicular to the base substrate, the main electrode part of the pixel electrode of the each sub-pixel is not overlapped with the control electrode of the driving sub-circuit of the pixel circuit of the each sub-pixel or the electrode part electrically connected with the control electrode, and the first electrode extension part of the pixel electrode of the each sub-pixel is at least partially overlapped with the control electrode of the driving sub-circuit of the pixel circuit of the each sub-pixel or the electrode part. As shown in FIG. 2, the sub-pixels in the even-numbered columns are the first type of sub-pixels.

The plurality of sub-pixels further include second type of sub-pixels, for each sub-pixel in the second type of sub-pixels, in the direction perpendicular to the base substrate, the main electrode part of the pixel electrode of the each sub-pixel is at least partially overlapped with the control electrode of the driving sub-circuit of the pixel circuit of the each sub-pixel. As shown in FIG. 2, the sub-pixels in the odd-numbered columns are the second type of sub-pixels; in other words, the plurality of pixel columns include first type of sub-pixel columns and second type of sub-pixel columns alternately arranged. For example, one of two sub-pixels adjacent in the first direction belongs to the first type of sub-pixels, and the other one belongs to the second type of sub-pixels.

For example, the first type of sub-pixels at least include two sub-pixels configured to emit light of different colors, for example, as shown in FIG. 2, the first type of sub-pixels include three sub-pixels (R sub-pixel, G sub-pixel, and B sub-pixel) configured to emit light of different colors, and the three sub-pixels are respectively configured to emit light of three basic colors (RGB).

For example, sub-pixels of each color include pixel electrodes of at least two different shapes. As shown in FIG. 2, the red sub-pixel, the green sub-pixel and the blue sub-pixel each have pixel electrodes of two shapes. For example, for the sub-pixels that emit light with a same color, the pixel electrodes of two shapes have different maximum dimensions in the first direction and also have different maximum dimensions in the second direction.

For example, in the direction perpendicular to the base substrate, the main electrode part of the pixel electrode of each sub-pixel in the first type of sub-pixels is not overlapped with the control electrode of the driving sub-circuit of the pixel circuit of the each sub-pixel, and the first electrode extension part of the pixel electrode of the each sub-pixel is at least partially overlapped with the control electrode of the driving sub-circuit of the pixel circuit of the each sub-pixel.

FIG. 2 also schematically shows the first via hole V1 in each pixel for connecting the first electrode extension part and the pixel circuit, by using a small hexagon. As shown in FIG. 2, an orthographic projection of a first via hole V1 in each sub-pixel in the first type of sub-pixels (that is, each sub-pixel in the even-numbered columns) on the base substrate is located, in the second direction D2, between an orthographic projection of the main electrode part of the pixel electrode of the each sub-pixel on the base substrate and an orthographic projection of the control electrode (node N1) of the driving sub-circuit of the pixel circuit of the each sub-pixel on the base substrate.

For example, as shown in FIG. 2, for at least one sub-pixel in the first type of sub-pixels, the orthographic projection of the first via hole V1 on the base substrate divides the orthographic projection of the each sub-pixel on the base substrate into a first projection part K1 and a second projection part K2 arranged along the second direction D2, and the first projection part and the second projection part are respectively located at opposite two sides of the orthographic projection of the first via hole V1 in the second direction D2. The first projection part K1 is at least partially overlapped with the orthographic projection of the control electrode of the driving sub-circuit of the pixel circuit of the sub-pixel or the electrode part directly electrically connected with the control electrode on the base substrate, that is, the first projection part K1 is a part of the orthographic projection of the first electrode extension part on the base substrate. In the second direction, a size of the second projection part is substantially the same as a size of the first projection part. For example, a ratio of the size of the second projection part to the size of the first projection part is from 0.7 to 1.5, for example, the ratio is 1.

For example, as shown in FIG. 2, the main electrode parts of the pixel electrodes of the plurality of sub-pixels are arranged in a plurality of pixel electrode rows along the first direction and a plurality of pixel electrode columns along the second direction; the plurality of pixel electrode rows include a first pixel electrode row and a second pixel electrode row that are adjacent; the sub-pixels including the pixel electrodes in the first pixel electrode row belong to the first type of sub-pixels, and the sub-pixels including the pixel electrodes in the second pixel electrode row belong to the second type of sub-pixels.

For example, in the second direction, a first via hole V1 of each sub-pixel to which each of the plurality of main electrode parts in the first pixel electrode row belongs is located at a side of the each main electrode part close to the second pixel electrode row, and a first via hole V2 of each sub-pixel to which each of the plurality of main electrode parts in the second pixel electrode row belongs is located at a side of the each main electrode part close to the first pixel electrode row. For example, as shown in FIG. 2, the first via hole V1 corresponding to the first pixel electrode row and the first via hole V2 corresponding to the second pixel electrode row, that is, the first via holes in each row of sub-pixels are basically arranged in a straight line, and the straight line extends along the first direction D1.

Figure 3A:
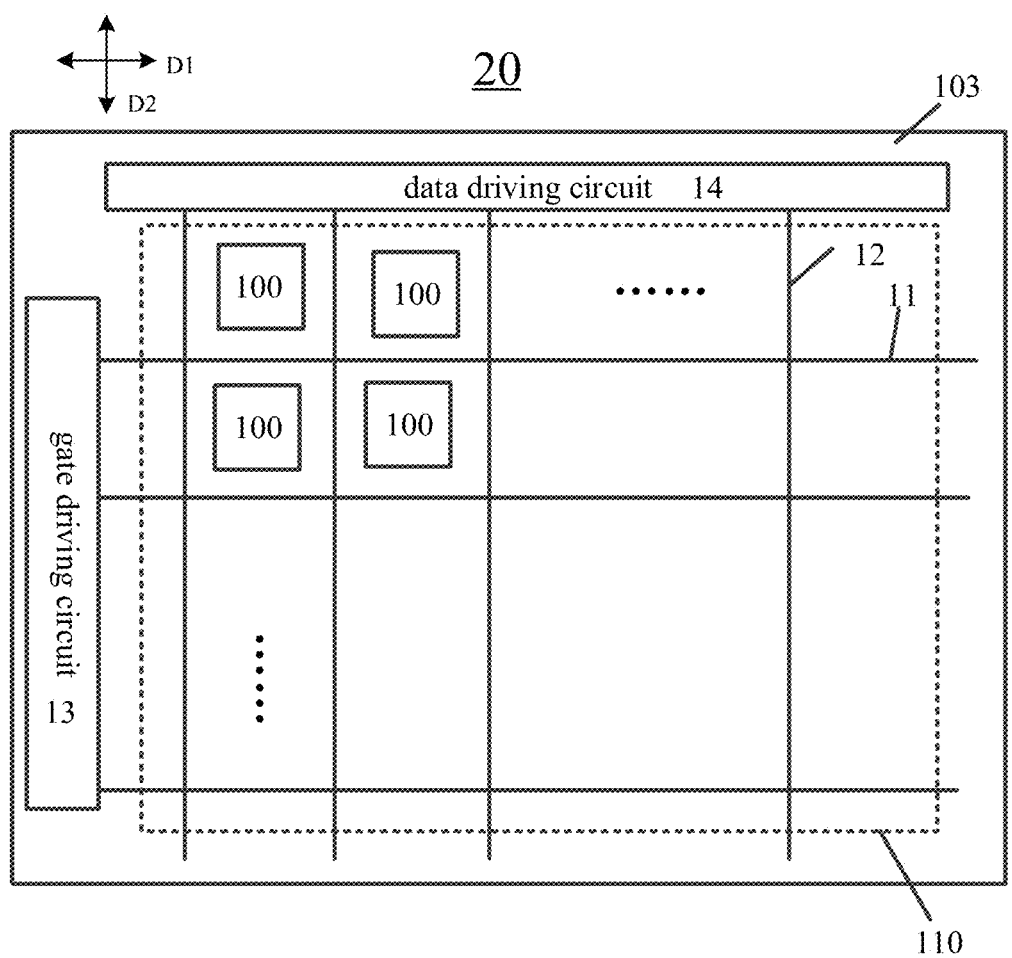
FIG. 3A is a second schematic diagram of a display substrate provided by at least one embodiment of the present disclosure.

FIG. 3A is a schematic diagram of a display substrate provided by some other embodiments of the present disclosure, as shown in FIG. 3A, the display substrate 20 includes a display region 110 and a non-display region 103 outside the display region 110. For example, the non-display region 103 is located in a peripheral region of the display region 110. The display substrate 20 includes a plurality of sub-pixels 100 in the display region 110. For example, the plurality of sub-pixels are arranged in an array, for example, a plurality of pixel rows and a plurality of pixel columns are arranged along the first direction D1 and the second direction D2, respectively. The first direction D1 and the second direction D2 are different, for example, the first direction D1 is perpendicular to the second direction D2. For example, it's not necessary for the pixel row and the pixel column to extend strictly along a straight line but may also extend along a curved line (such as a polyline), and the curved line generally extends along the first direction D1 or the second direction D2, respectively.

Each of the sub-pixels includes a pixel circuit that drives the light-emitting element to emit light, and a plurality of pixel circuits are arranged in an array along the first direction D1 and the second direction D2. For example, the sub-pixels constitute pixel units according to the traditional RGB mode to achieve full-color display, and the present disclosure is not intended to limit the arrangement mode of the sub-pixels and the method to achieve full-color display.

For example, as shown in FIG. 3A, the display substrate 20 further includes a plurality of conducting wires (for example, gate lines 11) extending along the first direction D1 and a plurality of conducting wires (for example, data lines 12) extending along the second direction D2 that are located in the display region 110, the plurality of horizontal conducting wires and the plurality of vertical conducting wires are crossed with each other to define a plurality of pixel regions in the display region 110, and one sub-pixel 100 is arranged corresponding to each of the pixel regions. FIG. 3A only illustrates approximate positional relationships of the gate lines 11, the data lines 12 and the sub-pixels 100 in the display substrate, which can be specifically designed according to actual requirements.

The pixel circuit is, for example, an nTmC (n and m are positive integers) pixel circuit, such as a 2T1C (that is, two transistors and one capacitor) pixel circuit, a 4T2C pixel circuit, a 5T1C pixel circuit, and a 7T1C pixel circuit. And in different embodiments, the pixel circuit may further include a compensation sub-circuit, the compensation sub-circuit includes an internal compensation sub-circuit or an external compensation sub-circuit, and the compensation sub-circuit may include transistors and capacitors, etc. For example, as required, the pixel circuit may further include a reset circuit, a light-emitting control sub-circuit, and a detection circuit, etc. For example, the display substrate may further include a gate driving circuit 13 and a data driving circuit 14 located in the non-display region. The gate driving circuit 13 is connected with the pixel circuits through the gate lines 11 to provide various scanning signals, and the data driving circuit 14 is connected with the pixel circuits through the data lines 12 to provide data signals. The positional relationship between the gate driving circuit 13 and the data driving circuit 14, and the positional relationship between the gate lines 11 and the data lines 12 in the display substrate shown in FIG. 1A are merely examples, and actual arrangement positions thereof can be designed as required.

For example, the display substrate 20 may further include a control circuit (not shown). For example, the control circuit is configured to control the data driving circuit 14 to apply the data signal, and to control the gate driving circuit to apply the scanning signal. An example of such a control circuit is a timing control circuit (T-con). The control circuit can be in various forms, for example, including a processor and a memory, the memory includes executable codes, and the processor runs the executable codes to perform the detection method mentioned above.

For example, the processor may be a central processing unit (CPU) or other forms of processing devices having data processing capabilities and/or instruction execution capabilities, for example, the processor may include a microprocessor and a programmable logic controller (PLC).

For example, a storage device may include one or more computer program products, the computer program products may include various forms of computer-readable storage mediums, such as volatile memory and/or non-volatile memory. The volatile memory may include, for example, random access memory (RAM) and/or cache memory (cache), etc. The non-volatile memory may include, for example, read only memory (ROM), hard disk and flash memory, etc. One or more computer program instructions may be stored on the computer-readable storage medium, and the processor may perform functions desired by the program instructions. Various application programs and various data can also be stored in the computer-readable storage medium.

Figure 3B:
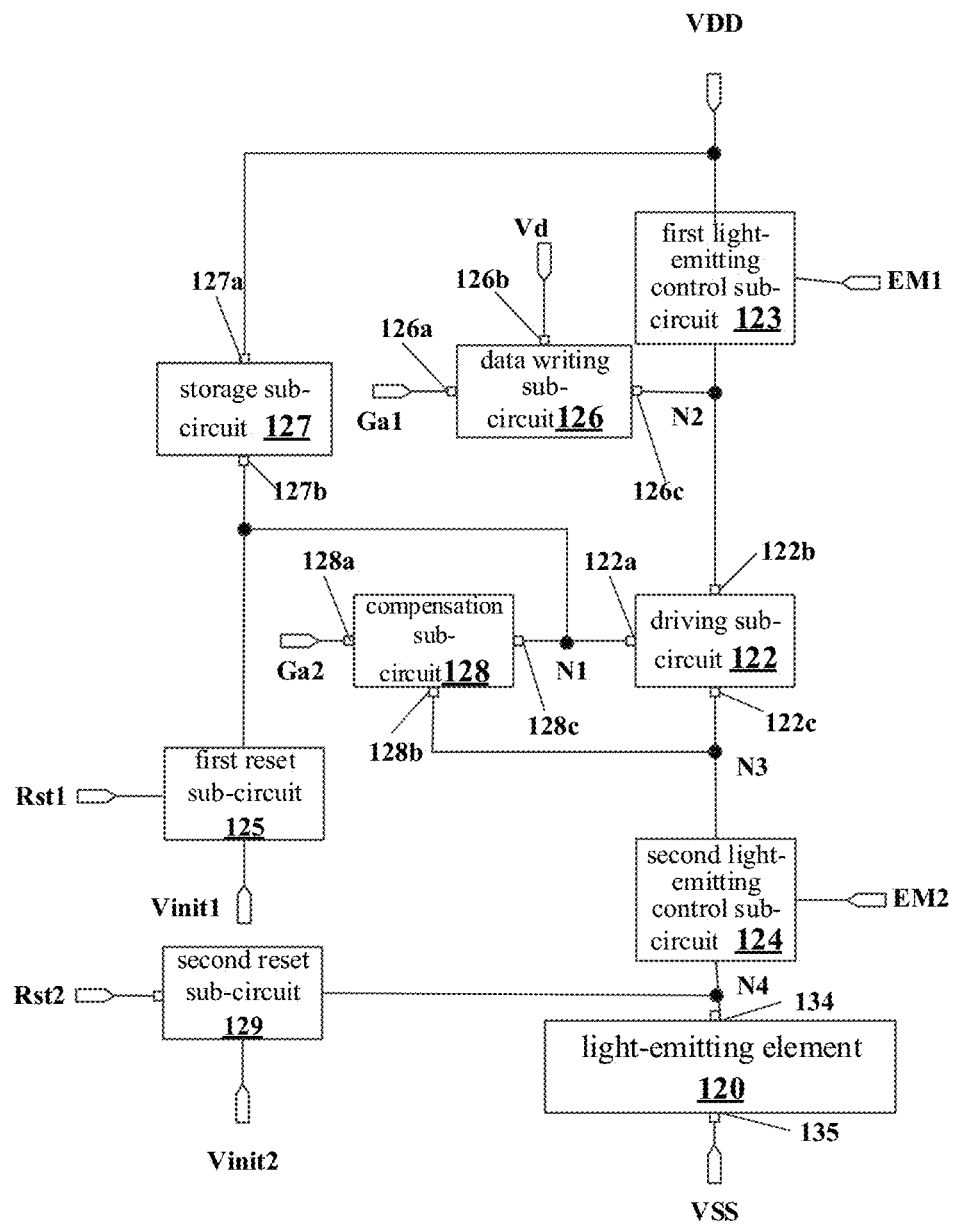
FIG. 3B is a first schematic circuit diagram of a pixel circuit in a display substrate provided by at least one embodiment of the present disclosure.

The pixel circuit may include a driving sub-circuit, a data writing sub-circuit, a compensation sub-circuit and a storage sub-circuit, and may also include a light-emitting control sub-circuit and a reset circuit as required. FIG. 3B shows a schematic diagram of a pixel circuit.

As shown in FIG. 3B, the pixel circuit includes a driving sub-circuit 122, a data writing sub-circuit 126 and a compensation sub-circuit 128.

For example, the driving sub-circuit 122 includes a control terminal (i.e., a control electrode) 122a, a first terminal 122b and a second terminal 122c, and is configured to be connected with a light-emitting element 120 and configured to control a driving current for driving the light-emitting element 120 according to a voltage on the control electrode.

The control terminal 122a of the driving sub-circuit 122 is connected with a first node N1, and the first terminal 122b of the driving sub-circuit 122 is connected with a second node N2, and the second terminal 122c of the driving sub-circuit 122 is connected with a third node N3.

For example, the data writing sub-circuit 126 is connected with the driving sub-circuit 122 and is configured to write a data signal to the first terminal 122b of the driving sub-circuit 122 in response to a first scanning signal. For example, as shown in FIG. 3B, the data circuit 126 includes a control terminal 126a, a first terminal 126b and a second terminal 126c, the control terminal 126a is configured to receive a first scanning signal Ga1, the first terminal 126b is configured to receive a data signal Vd, and the second terminal 126c is connected to the first terminal 122b (that is, the second node N2) of the driving sub-circuit 122. The data writing sub-circuit 126 is configured to write the data signal Vd to the first terminal 122b of the driving sub-circuit 122 in response to the first scanning signal Ga1. For example, the first terminal 126b of the data writing sub-circuit 126 is connected with the data line 12 to receive the data signal Vd, and the control terminal 126a is connected with the gate line 11 used as a scanning line to receive the first scanning signal Ga1. For example, in the data writing and compensation stage, the data writing sub-circuit 126 can be turned on in response to the first scanning signal Ga1, so that the data signal can be written into the first terminal 122b (the second node N2) of the driving sub-circuit 122, and the data signal can be stored, thus a driving current for driving the light-emitting element 120 to emit light can be generated according to the data signal, for example, in the light-emitting stage.

For example, the compensation sub-circuit 128 is connected with the driving sub-circuit 122 and is configured to compensate the driving sub-circuit 122 in response to the second scanning signal, and the second scanning signal may be the same as or different from the first scanning signal. For example, as shown in FIG. 3B, the compensation sub-circuit 128 includes a control terminal 128a, a first terminal 128b and a second terminal 128c, the control terminal 128a of the compensation sub-circuit 128 is configured to receive the second scanning signal Ga2, the first terminal 128b and the second terminal 128c of the compensation sub-circuit 128 are electrically connected with the second terminal 122c and the control terminal 122a of the driving sub-circuit 122, respectively, and the compensation sub-circuit 128 is configured to perform threshold compensation on the driving sub-circuit 122 in response to the second scanning signal Ga2.

For example, the pixel circuit further includes a storage sub-circuit 127, a first light-emitting control sub-circuit 123, a second light-emitting control sub-circuit 124, and a first reset sub-circuit 125 and a second reset sub-circuit 129.

For example, the first scanning signal Ga1 may be the same as the second scanning signal Ga2. For example, the first scanning signal Ga1 and the second scanning signal Ga2 may be connected to a same signal output terminal. For example, the first scanning signal Ga1 and the second scanning signal Ga2 may be transmitted through a same scanning line.

In other examples, the first scanning signal Ga1 may also be different from the second scanning signal Ga2. For example, the first scanning signal Ga1 and the second scanning signal Ga2 may be connected to different signal output terminals. For example, the first scanning signal Ga1 and the second scanning signal Ga2 may be transmitted through different scanning lines respectively.

The storage sub-circuit 127 includes a first terminal (also referred to as a first storage electrode) 127a and a second terminal (also referred to as a second storage electrode) 127b, the first terminal 127a of the storage sub-circuit is configured to receive a first power supply voltage VDD, and the second terminal 127b of the storage sub-circuit is electrically connected with the control terminal 122a of the driving sub-circuit. For example, in the data writing and compensation phase, the compensation sub-circuit 128 can be turned on in response to the second scanning signal Ga2, thus the data signal written by the data writing sub-circuit 126 can be stored in the storage sub-circuit 127; at the same time, the compensation sub-circuit 128 can be electrically connected with the control terminal 122a and the second terminal 122c of the driving sub-circuit 122, therefore, relevant information of the threshold voltage of the driving sub-circuit 122 can be correspondingly stored in the storage sub-circuit, thus, for example, the stored data signal and the threshold voltage can be used to control the driving sub-circuit 122 in the light-emitting stage, so that the output of the driving sub-circuit 122 is compensated.

For example, the storage sub-circuit 127 is electrically connected with the control terminal 122a and the first voltage terminal VDD of the driving sub-circuit 122, and is configured to store a data signal written by the data writing sub-circuit 126. For example, in the data writing and compensation stage, the compensation sub-circuit 128 can be turned on in response to the second scanning signal Ga2, thus the data signal written by the data writing sub-circuit 126 can be stored in the storage sub-circuit 127. For example, at the same time in the data writing and compensation phase, the compensation sub-circuit 128 can be electrically connected with the control terminal 122a and the second terminal 122c of the driving sub-circuit 122, therefore, the relevant information of the threshold voltage of the driving sub-circuit 122 can be correspondingly stored in the storage sub-circuit, thus, for example, the stored data signal and the threshold voltage can be used to control the driving sub-circuit 122 in the light-emitting stage, so that the output of the driving sub-circuit 122 is compensated.

For example, the first light-emitting control sub-circuit 123 is connected with the first terminal 122b (the second node N2) of the driving sub-circuit 122 and the first voltage terminal VDD, and is configured to apply a first power supply voltage of the first voltage terminal VDD to the first terminal 122b of the driving sub-circuit 122 in response to the first light-emitting control signal EM1. For example, as shown in FIG. 1B, the first light-emitting control sub-circuit 123 is connected with the first light-emitting control terminal EM1, the first voltage terminal VDD and the second node N2.

For example, the second light-emitting control sub-circuit 124 is connected with the second light-emitting control terminal EM2, the first terminal 134 of the light-emitting element 120, and the second terminal 122c of the driving sub-circuit 122, and is configured to allow a driving current to be applied to the light-emitting element 122 in response to the second light-emitting control signal.

For example, in a light-emitting stage, the second light-emitting control sub-circuit 123 is turned on in response to the second light-emitting control signal EM2 provided by the second light-emitting control terminal EM2, therefore, the driving sub-circuit 122 can be electrically connected with the light-emitting element 120 through the second light-emitting control sub-circuit 123, thus the light-emitting element 120 is driven to emit light under the control of the driving current; in a non-light-emitting phase, the second light-emitting control sub-circuit 123 is turned off in response to the second light-emitting control signal EM2, thus the light-emitting element 120 can be prevented from being caused to emit light by the current flowing through it, and a contrast ratio of the corresponding display device can be improved.

For another example, in an initialization stage, the second light-emitting control sub-circuit 124 may also be turned on in response to the second light-emitting control signal, so that a reset circuit can be combined to perform a reset operation on the driving sub-circuit 122 and the light-emitting element 120.

For example, the second light-emitting control signal EM2 may be the same as the first light-emitting control signal EM1, for example, the second light-emitting control signal EM2 can be connected to a same signal output terminal as the first light-emitting control signal EM, for example, the second light-emitting control signal EM2 may be transmitted through a same light-emitting control line as the first light-emitting control signal EM.

In other examples, the second light-emitting control signal EM2 may be different from the first light-emitting control signal EM1. For example, the second light-emitting control signal EM2 and the first light-emitting control signal EM1 may be respectively connected to different signal output terminals. For example, the second light-emitting control signal EM2 and the first light-emitting control signal EM1 may be respectively transmitted through different light-emitting control lines.

For example, the first reset sub-circuit 125 is connected to the first reset voltage terminal Vinit1 and the control terminal 122a (the first node N1) of the driving sub-circuit 122, and is configured to apply the first reset voltage Vinit1 to the control terminal 122a of the driving sub-circuit 122 in response to the first reset control signal Rst1.

For example, the second reset sub-circuit 129 is connected with the second reset voltage terminal Vinit2 and the first terminal 122b (the fourth node N4) of the light-emitting element 122, and is configured to apply a second reset voltage Vinit2 to the first terminal 134 of the light-emitting element 120 in response to the second reset control signal Rst2. For example, the first reset voltage Vinit1 and the second reset voltage Vinit2 may be a same voltage signal or different voltage signals. For example, the first reset voltage terminal Vinit1 and the second reset voltage terminal Vinit2 are connected to a same reset voltage source end (for example, in the non-display region) to receive a same reset voltage.

For example, the first reset sub-circuit 125 and the second reset sub-circuit 129 may be turned on in response to the first reset control signal Rst1 and the second reset control signal Rst2, respectively, therefore, the second reset voltage Vinit2 can be applied to the first node N1 and the first reset voltage Vinit1 can be applied to the first terminal 134 of the light-emitting element 120, respectively, thus a reset operation can be performed on the driving sub-circuit 122, the compensation sub-circuit 128 and the light-emitting element 120, so that the influence of the previous light-emitting stage is eliminated.

For example, a second reset control signal Rst2 of each row of sub-pixels may be the same signal as a first scanning signal Ga1 of the row of sub-pixels, and the second reset control signal Rst and the first scanning signal Ga1 may be transmitted through a same gate line 11. For example, the first reset control signal Rst1 of each row of sub-pixels may be the same signal as a first scanning signal Ga1 of the previous row of sub-pixels, and the first reset control signal Rst1 and the first scanning signal Ga1 can be transmitted through the same gate line 11.

For example, the light-emitting element 120 includes a first terminal (also referred to as a first electrode or a pixel electrode) 134 and a second terminal (also referred to as a second electrode) 135, the first terminal 134 of the light-emitting element 120 is connected with the fourth node, the second terminal 135 of the light-emitting element 120 is configured to be connected with the second voltage terminal VSS. For example, in one example, as shown in FIG. 3B, the second terminal 122c of the driving sub-circuit 122 may be connected with the fourth node N4 through the second light-emitting control sub-circuit 124. Embodiments of the present disclosure include, but are not limited to, this case.

It should be noted that, in the descriptions of the embodiments of the present disclosure, the first node N1, the second node N2, the third node N3 and the fourth node N4 do not necessarily represent actual components, but represent junctions of related circuit connections in a circuit diagram.

It should be noted that, in the descriptions of the embodiments of the present disclosure, the symbol Vd can represent either the data signal end, or a level of the data signal, similarly, the symbols Ga1 and Ga2 can represent either the first scanning signal and the second scanning signal, or the first scanning signal end and the second scanning signal end, Rst1 and Rst2 can represent either the reset control terminal, or the reset control signal. The symbols Vinit1 and Vinit2 can represent either the first reset voltage terminal and the second reset voltage terminal, or the first reset voltage and the second reset voltage. The symbol VDD may represent either the first voltage terminal or the first power supply voltage, and the symbol VSS may represent either the second voltage terminal or the second power supply voltage. The following embodiments are the same, which will not be repeated herein.

Figure 3C:
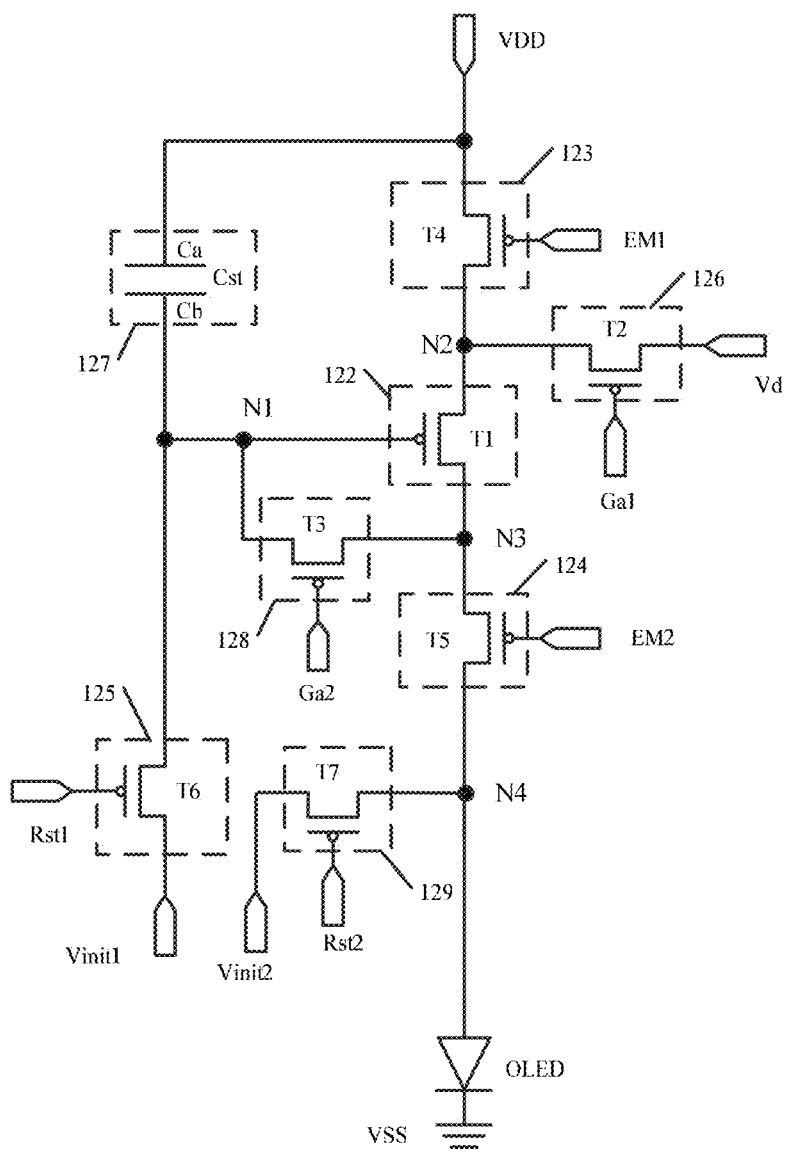
FIG. 3C is a second schematic circuit diagram of a pixel circuit in a display substrate provided by at least one embodiment of the present disclosure.

FIG. 3C is a circuit diagram of a specific implementation example of the pixel circuit shown in FIG. 3B. As shown in FIG. 3C, the pixel circuit includes: first to seventh transistors T1, T2, T3, T4, T5, T6, T7 and a storage capacitor Cst.

For example, as shown in FIG. 3C, the driving sub-circuit 122 may be implemented as a first transistor T1 (that is, a driving transistor). A gate electrode of the first transistor T1 serves as the control terminal 122a of the driving sub-circuit 122, and is connected with the first node N1; a first electrode of the first transistor T1 serves as the first terminal 122b of the driving sub-circuit 122, and is connected with the second node N2; a second electrode of the first transistor T1 serves as the second terminal 122c of the driving sub-circuit 122, and is connected with the third node N3.

For example, as shown in FIG. 3C, the data writing sub-circuit 126 may be implemented as a second transistor T2. A gate electrode of the second transistor T2 is connected with the first scanning line (the first scanning signal end Ga1) to receive a first scanning signal, the first electrode of the second transistor T2 is connected with the data line (the data signal end Vd) to receive a data signal, and the second electrode of the second transistor T2 is connected with the first terminal 122b (the second node N2) of the driving sub-circuit 122.

For example, as shown in FIG. 3C, the compensation sub-circuit 128 may be implemented as a third transistor T3 (that is, a compensation transistor). The gate electrode, the first electrode and second electrode of the third transistor T3 serve as the control terminal 128a, the first terminal 128b and the second terminal 128c of the compensation sub-circuit, respectively. The gate electrode of the third transistor T3 is configured to be connected with the second scanning line (the second scanning signal end Ga2) to receive a second scanning signal, the first electrode of the third transistor T3 is connected with the second terminal 122c (the third node N3) of the driving sub-circuit 122, and the second electrode of the third transistor T3 is connected with the control terminal 122 a (the first node N1) of the driving sub-circuit 122.

For example, as shown in FIG. 3C, the storage sub-circuit 127 may be implemented as a storage capacitor Cst, the storage capacitor Cst includes a first capacitor electrode Ca and a second capacitor electrode Cb, the first capacitor electrode Ca is connected with the first voltage terminal VDD, and the second capacitor electrode Cb is connected with the control terminal 122 of the driving sub-circuit 122.

For example, as shown in FIG. 3C, the first light-emitting control sub-circuit 123 may be implemented as a fourth transistor T4. A gate electrode of the fourth transistor T4 is connected with the first light-emitting control line (the first light-emitting control terminal EM1) to receive a first light-emitting control signal, the first electrode of the fourth transistor T4 is connected with the first voltage terminal VDD to receive a first power supply voltage, and the second electrode of the fourth transistor T4 is connected with the first terminal 122b (the second node N2) of the driving sub-circuit 122.

For example, the light-emitting element 120 is implemented as a light-emitting diode (LED), for example, the light-emitting element 120 can be an organic light-emitting diode (OLED), a quantum dot light-emitting diode (QLED), or an inorganic light-emitting diode, for example, the light-emitting element 120 can be a micro light-emitting diode (Micro LED) or a micro OLED. For example, the light-emitting element 120 may be a top emission structure, a bottom emission structure, or a double-sided emission junction. The light-emitting element 120 can emit red light, green light, blue light or white light. The embodiments of the present disclosure do not limit the specific structure of the light-emitting element.

For example, the light-emitting element 120 includes a first electrode 134, a second electrode 135, and an organic functional layer sandwiched between the first electrode 134 and the second electrode 135; the organic functional layer includes a light-emitting layer, and may further include a hole injection layer, a hole transport layer, an electron injection layer and an electron transport layer as required.

For example, the first electrode 134 (also referred to as a pixel electrode, such as an anode) of the light-emitting element 120 is connected with the fourth node N4, and is configured to be connected to the second terminal 122c of the driving sub-circuit 122 through the second light-emitting control sub-circuit 124; the second electrode 135 (for example, a cathode) of the light-emitting element 120 is configured to be connected with the second voltage terminal VSS to receive a second power supply voltage VSS; the current flowing into the light-emitting element 120 from the second terminal 122c of the driving sub-circuit 122 determines the brightness of the light-emitting element. For example, the second voltage terminal may be grounded, that is, VSS may be 0V. For example, the second power supply voltage VSS may be a negative voltage.

For example, the second light-emitting control sub-circuit 124 may be implemented as a fifth transistor T5. The gate electrode of the fifth transistor T5 is connected with the second light-emitting control line (the second light-emitting control terminal EM2) to receive a second light-emitting control signal, the first electrode of the fifth transistor T5 is connected with the second terminal 122c (the third node N3) of the driving sub-circuit 122, and the second electrode of the fifth transistor T5 is connected with the first terminal 134 (the fourth node N4) of the light-emitting element 120.

For example, the first reset sub-circuit 125 may be implemented as a sixth transistor T6, and the second reset sub-circuit is implemented as a seventh transistor T7. The gate electrode of the sixth transistor T6 is configured to be connected with the first reset control terminal Rst1 to receive a first reset control signal Rst1, the first electrode of the sixth transistor T6 is connected with the first reset voltage terminal Vinit1 to receive a first reset voltage Vinit1, and the second electrode of the sixth transistor T6 is configured to be connected with the first node N1. The gate electrode of the seventh transistor T7 is configured to be connected with the second reset control terminal Rst2 to receive a second reset control signal Rst2, the first electrode of the seventh transistor T7 is connected with the second reset voltage terminal Vinit2 to receive a second reset voltage Vinit2, and the second electrode of the seventh transistor T7 is configured to be connected with the fourth node N4.

It should be noted that the transistors used in the embodiments of the present disclosure may all be thin film transistors or field effect transistors or other switching devices with the same characteristics, and in the embodiments of the present disclosure, the thin film transistor is described by way of example. The source electrode and the drain electrode of the transistor used here can be symmetrical in structure, and hence may be indistinguishable in structure. In the embodiment of the present disclosure, in order to distinguish the two electrodes of the transistor except the gate electrode, one of the electrodes is described as a first electrode, and the other one is described as a second electrode.

In addition, transistors can be classified into N-type transistors and P-type transistors according to their characteristics. In a case that the transistor is the P-type transistor, a turned-on voltage is a low-level voltage (for example, 0V, −5V, −10V, or other suitable voltage), and a turned-off voltage is a high level voltage (for example, 5V, 10V or other suitable voltage); in a case that the transistor is the N-type transistor, the turned-on voltage is a high-level voltage (for example, 5V, 10V, or other suitable voltage), and the turned-off voltage is a low level voltage (for example, 0V, −5V, −10V, or other suitable voltage). For example, as shown in FIG. 1B, the first transistor T1 to the seventh transistor T7 are all P-type transistors, such as low temperature polysilicon thin film transistors. However, the embodiments of the present disclosure do not limit the types of the transistors, and when the type of the transistors is changed, the connection relationship in the circuit can be adjusted accordingly.

Figure 3D:
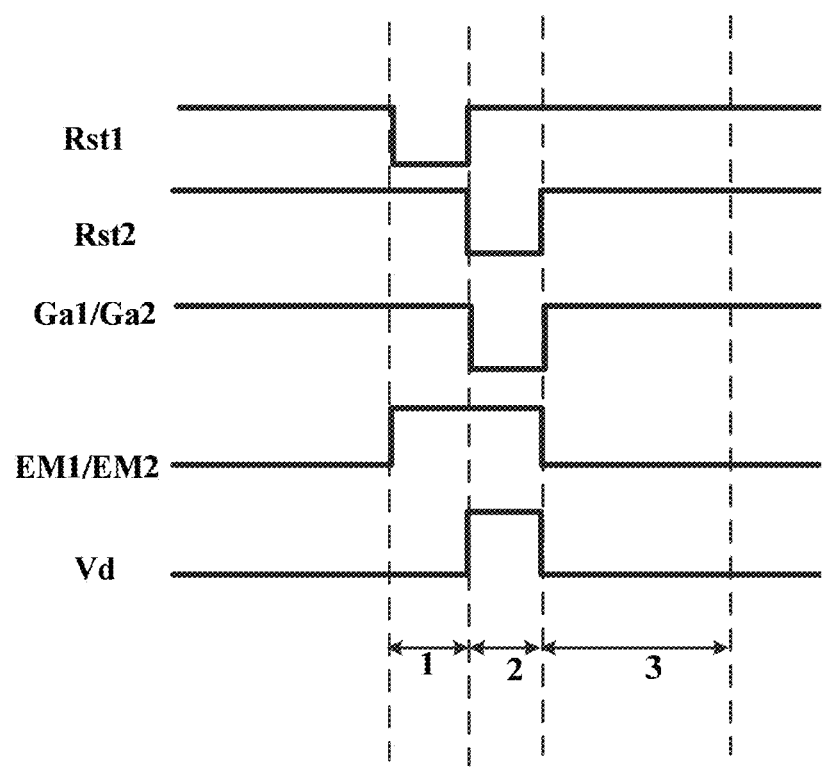
FIG. 3D is a timing signal diagram of a pixel circuit provided by at least one embodiment of the present disclosure.

The working principle of the pixel circuit shown in FIG. 3C will be described below with reference to the signal timing diagram shown in FIG. 3D. As shown in FIG. 3D, the display process of each frame of an image includes three stages, which are an initialization stage 1, a data writing and compensation stage 2, and a light-emitting stage 3, respectively.

As shown in FIG. 3D, in the embodiment, the first scanning signal Ga1 and the second scanning signal Ga2 use the same signal, the first light-emitting control signal EM1 and the second light-emitting control signal EM2 use the same signal; the second reset control signal Rst2 and the first scanning signal Ga1/the second scanning signal Ga2 have the same waveform, that is, the second reset control signal Rst2, the first scanning signal Ga1/the second scanning signal Ga2 can use the same signal; the first reset signal Rst1 of the sub-pixel in the current row has a same waveform as the first scanning signal Ga1 or the second scanning signal Ga2 of the sub-pixel in the previous row, that is, using the same signal. However, it's not intended to constitute any limitation to the present disclosure, and in some other embodiments, different signals may be used as the first scanning signal Ga1, the second scanning signal Ga2, the first reset control signal Rst1, and the second reset control signal Rst2, respectively, and different signals may be used as the first light-emitting control signal EM1 and the second light-emitting control signal EM2, respectively.

In the initialization stage 1, the first reset control signal Rst1 is input to turn on the sixth transistor T6, and the first reset voltage Vinit1 is applied to the gate electrode of the first transistor T1, so that the first node N1 is reset.

In the data writing and compensation stage 2, the first scanning signal Ga1, the second scanning signal Ga2 and the data signal Vd are input, so that the second transistor T2 and the third transistor T3 are turned on, the data signal Vd is written into the second node N2 through the second transistor T2, and the first node N1 is charged through the first transistor T1 and the third transistor T3 until the potential of the first node N1 changes to Vd+Vth, and then the first transistor T1 is turned off, where Vth is a threshold voltage of the first transistor T1. The potential of the first node N1 is stored in the storage capacitor Cst and is maintained, that is, the voltage information with the data signal and the threshold voltage Vth is stored in the storage capacitor Cst, for providing grayscale display data and for compensating for the threshold voltage of the first transistor T1 itself in the subsequent light-emitting stage.

In the data writing and compensation stage 2, the second reset control signal Rst2 can also be input to turn on the seventh transistor T7, the second reset voltage Vinit2 is applied to the fourth node N4, so that the fourth node N4 is reset. For example, the reset of the fourth node N4 can also be performed in the initialization phase 1, for example, the first reset control signal Rst1 may be as same as the second reset control signal Rst2, without limited in the embodiments of the present disclosure.

In the light-emitting stage 3, the first light-emitting control signal EM1 and the second light-emitting control signal EM2 are input to turn on the fourth transistor T4, the fifth transistor T5 and the first transistor T1, and a driving current is applied to the OLED by the fifth transistor T5 so as to drive the OLED to emit light. A value of the driving current I flowing through the OLED can be obtained according to the following formula:

I=K(VGS−Vth)2=K[(Vdata+Vth−VDD)−Vth]$^2$=K (Vdata−VDD)$^2$, where K is a conductivity of the first transistor.

In the above formula, Vth represents a threshold voltage of the first transistor T1, VGS represents a voltage between the gate electrode and source electrode (that is, the first electrode herein) of the first transistor T1, and K is a constant value associated with the first transistor T1 itself. It can be seen from the calculation formula of I mentioned above, the driving current I flowing through the OLED is no longer related to the threshold voltage Vth of the first transistor T1; in this way, the compensation for the pixel circuit can be realized, the problem of threshold voltage drift of the driving transistor (that is, the first transistor T1 in the embodiment of the present disclosure) caused by the manufacturing process and long-term operation is solved, and an influence of the threshold voltage drift on the driving current I is eliminated, so that the display effect of the display device using the pixel circuit can be improved.

It can be seen that in the light-emitting stage, the potential of the gate electrode of the first transistor T1 (that is, the first node N1) directly affects a magnitude of the driving current I, thus the parasitic capacitance at the first node N1 will affect the magnitude of the driving current. The parasitic capacitance between the first node N1 and the pixel electrode (that is, the fourth node N4) will cause an excessively higher potential at the first node N1, thus resulting in a reduced driving current.

For example, referring to FIG. 1, due to the parasitic capacitance between the first node N1 and the pixel electrode (that is, the fourth node N4), the driving current is reduced and the pixel brightness is lowered for the sub-pixels in the odd-numbered columns, but the driving current of the even-numbered columns is not affected, which eventually leads to uneven display of the screen.

In the following, the structure of the display substrate provided by at least one embodiment of the present disclosure is exemplarily described with reference to the case of the pixel circuit shown in FIG. 3C, by way of example, in conjunction with FIG. 4A to FIG. 4C, FIG. 5, FIG. 6A to FIG. 6B, FIG. 7A to FIG. 7B, and FIG. 8A to FIG. 8B. However, the inventive concept of the present disclosure is not limited to this specific pixel structure.

Figure 4A:
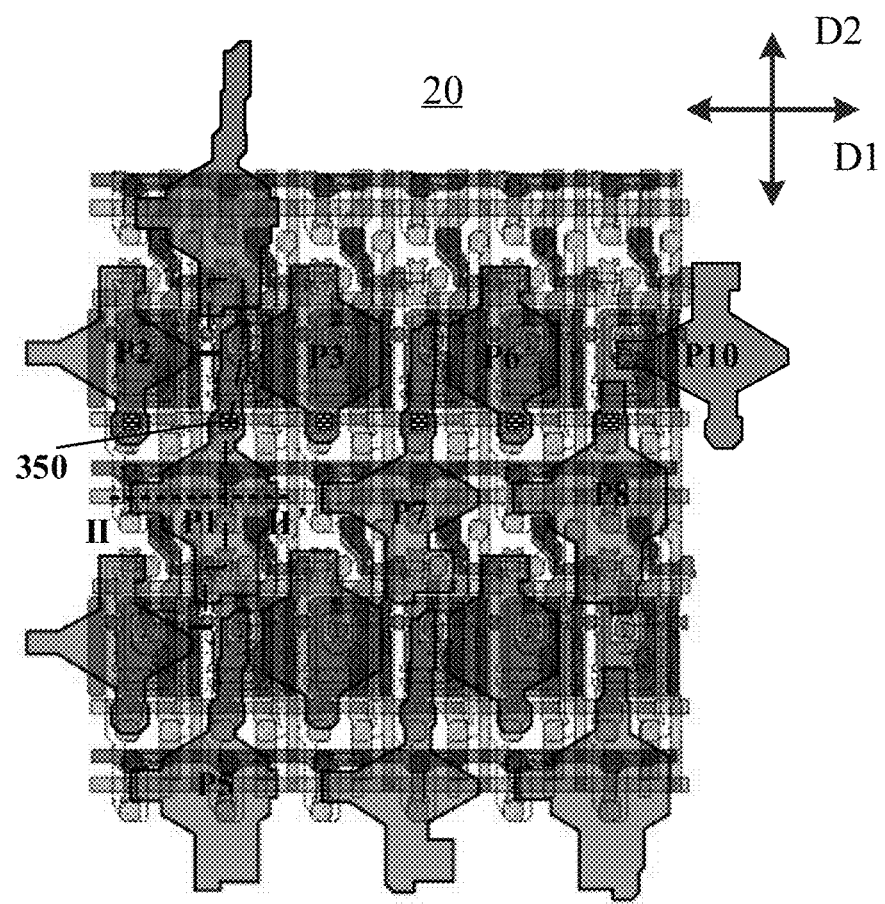
FIG. 4A is a third schematic diagram of a display substrate provided by at least one embodiment of the present disclosure.
Figure 4B:
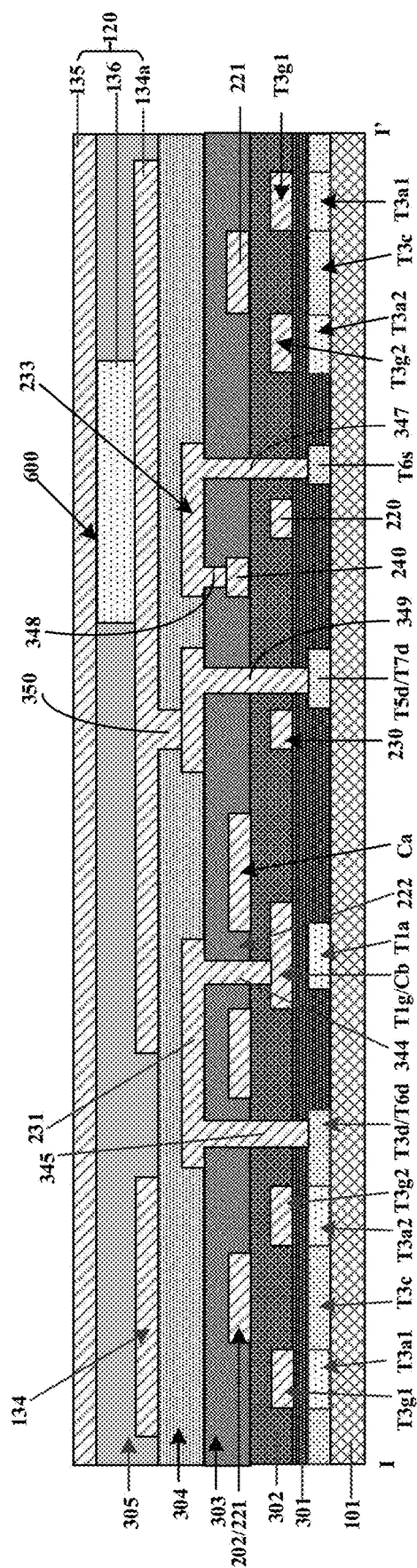
FIG. 4B is a cross-sectional view taken along a section line I-I' in FIG. 4A.
Figure 4C:
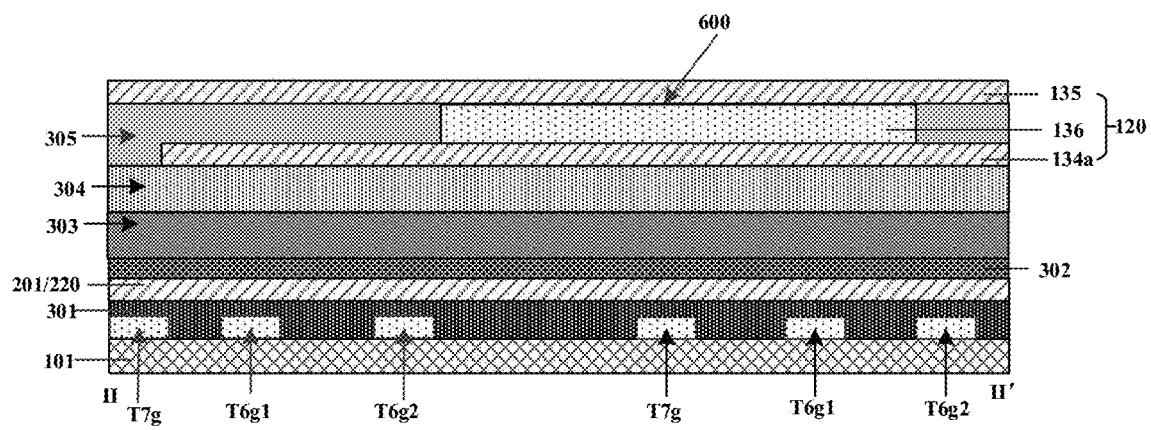
FIG. 4C is a cross-sectional view taken along a section line II-II' in FIG. 4B.
Figure 7A:
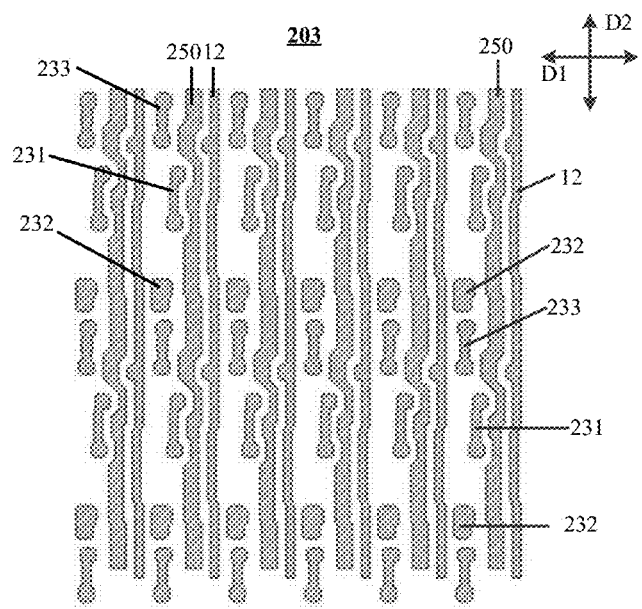
FIG. 7A is a seventh schematic diagram of a display substrate provided by at least one embodiment of the present disclosure.
Figure 7B:
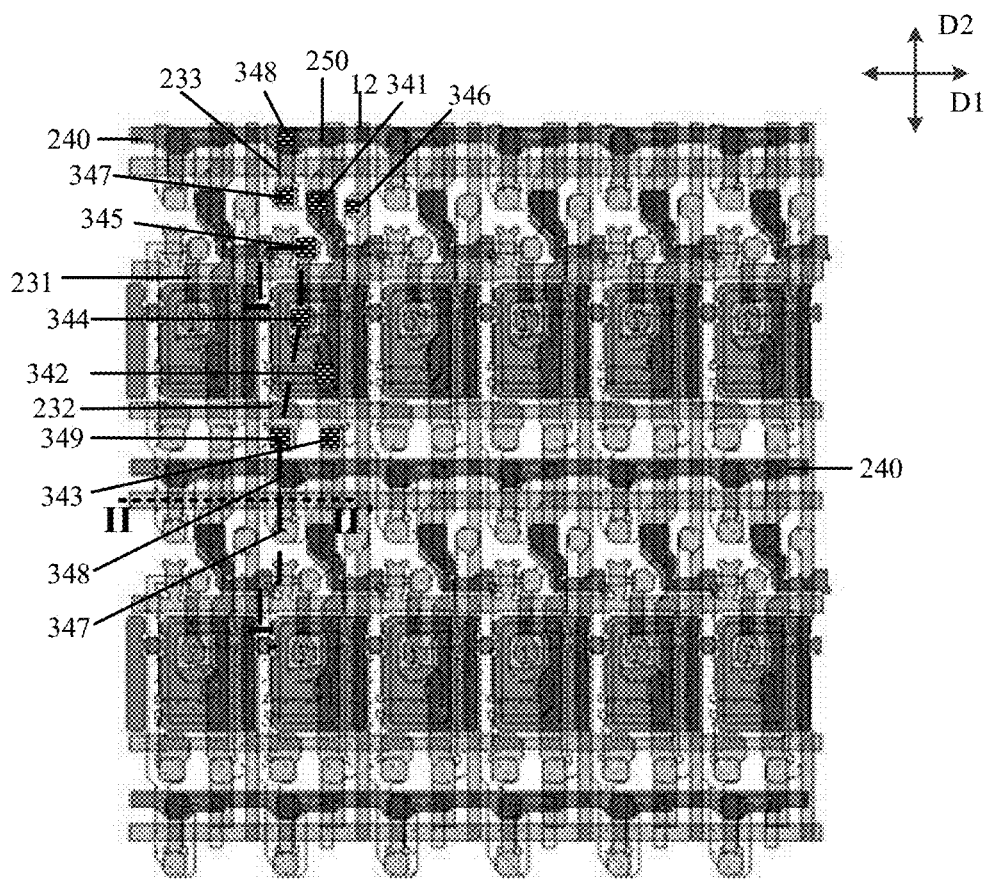
FIG. 7B is an eighth schematic diagram of a display substrate provided by at least one embodiment of the present disclosure.
Figure 8A:
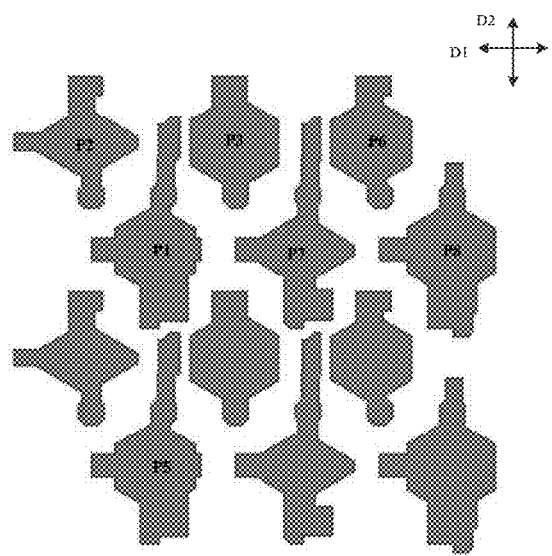
FIG. 8A is a ninth schematic diagram of a display substrate provided by at least one embodiment of the present disclosure.
Figure 8B:
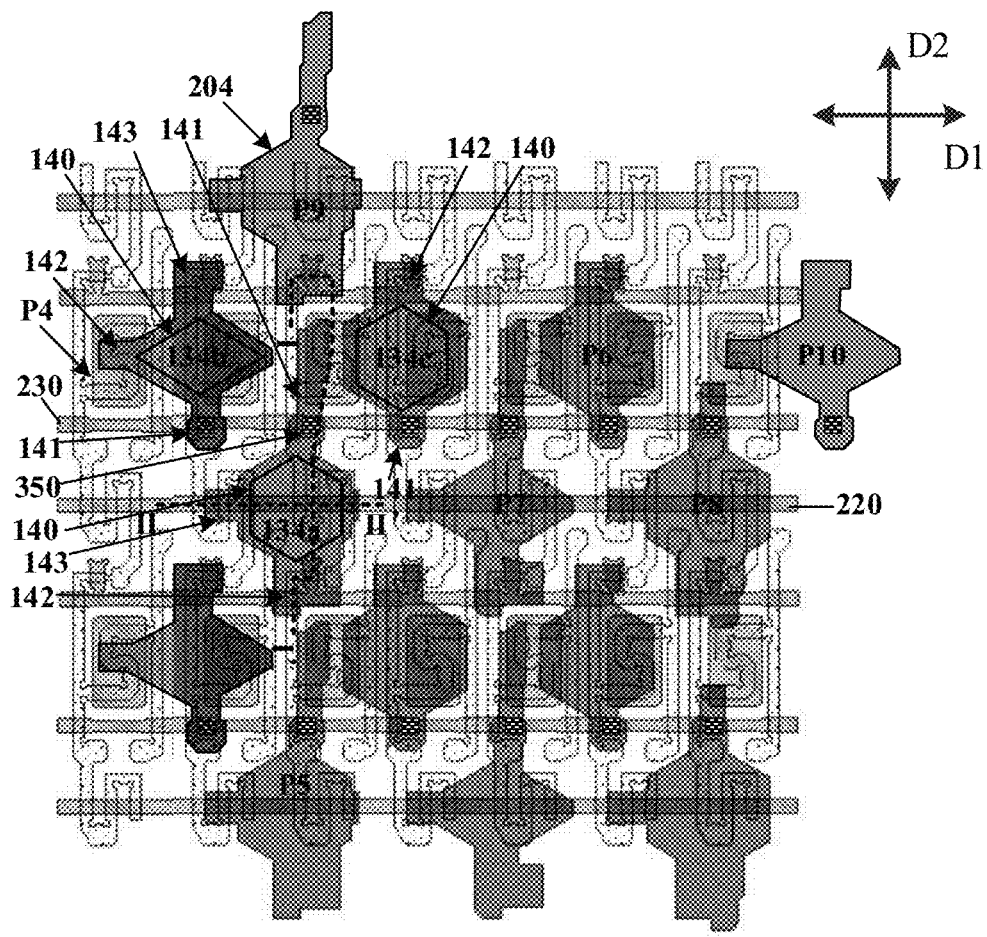
FIG. 8B is a tenth schematic diagram of a display substrate provided by at least one embodiment of the present disclosure.

FIG. 4A is a schematic diagram of a display substrate 20 provided by some other embodiments of the present disclosure, FIG. 4B is a cross-sectional view of FIG. 4A along a section line I-I', and FIG. 4C is a cross-sectional view of FIG. 4A along a section line II-II'. It should be noted that, for the sake of clarity, FIG. 4B and FIG. 4C respectively omit some structures that do not have a direct electrical connection relationship at the section lines; FIG. 4C omits the patterns in the second conductive layer 202 and the third conductive layer 203; and positions of the section line I-I' and the section line II-II' are shown in FIG. 7B and FIG. 8B, respectively.

For example, the arrangement mode of the pixels in the display substrate shown in FIG. 4A is the same as the arrangement mode of the pixels in the display substrate shown in FIG. 2, and the difference only lies in the shapes of the pixel electrodes.

As shown in FIG. 4A, the display substrate 20 includes a base substrate 101, and a plurality of sub-pixels 100 are located on the base substrate 101. Pixel circuits of the plurality of sub-pixels 100 are arranged in a pixel circuit array, for example, a row direction of the pixel circuit array is the first direction D1, and a column direction of the pixel circuit array is the second direction D2. In some embodiments, the pixel circuits of the plurality of sub-pixels may have exactly the same structure, that is, the pixel circuits are repeatedly arranged in the row direction and in the column direction.

For the convenience of description, FIG. 4A exemplarily shows sub-pixels in two rows and six columns. For example, as shown in FIG. 4A, an arrangement rule of the pixel circuits of the sub-pixels is different from an arrangement rule of the pixel electrodes (134$a$, 134$b$, 134$c$, etc.) above the pixel circuits; for the convenience of explanation, the description of the arrangement of the sub-pixels herein can be referred to the arrangement rule of the pixel circuits, and the description of relative positional relationships of the sub-pixels can be referred to relative positions of the pixel circuits of the sub-pixels, for example, adjacent sub-pixels refer to sub-pixels whose pixel circuits are adjacent, which can be applied to the following embodiments, and will not be repeated.

For example, the plurality of sub-pixels include first sub-pixels P1, second sub-pixels P2 and third sub-pixels P3. The first sub-pixel P1, the second sub-pixel P2 and the third sub-pixel P3 are configured to emit light of different colors, for example, they are configured to emit green light, red light, and blue light, respectively. For example, the first sub-pixel, the second sub-pixel and the third sub-pixel are adjacent in the first direction. FIG. 4A shows the pixel electrode 134a of the first sub-pixel, the pixel electrode 134b of the second sub-pixel, and the pixel electrode 134c of the third sub-pixels.

Combined with FIG. 4A to FIG. 4C, it can be seen that, a semiconductor layer 102, a first insulating layer 301, a first conductive layer 201, a second insulating layer 302, a second conductive layer 202, a third insulating layer 303, a third conductive layer 203, a fourth insulating layer 304, and a fourth conductive layer 204 are sequentially arranged on the base substrate 101, so that the structure of the display substrate as shown in FIG. 4A is formed.

Figure 5:
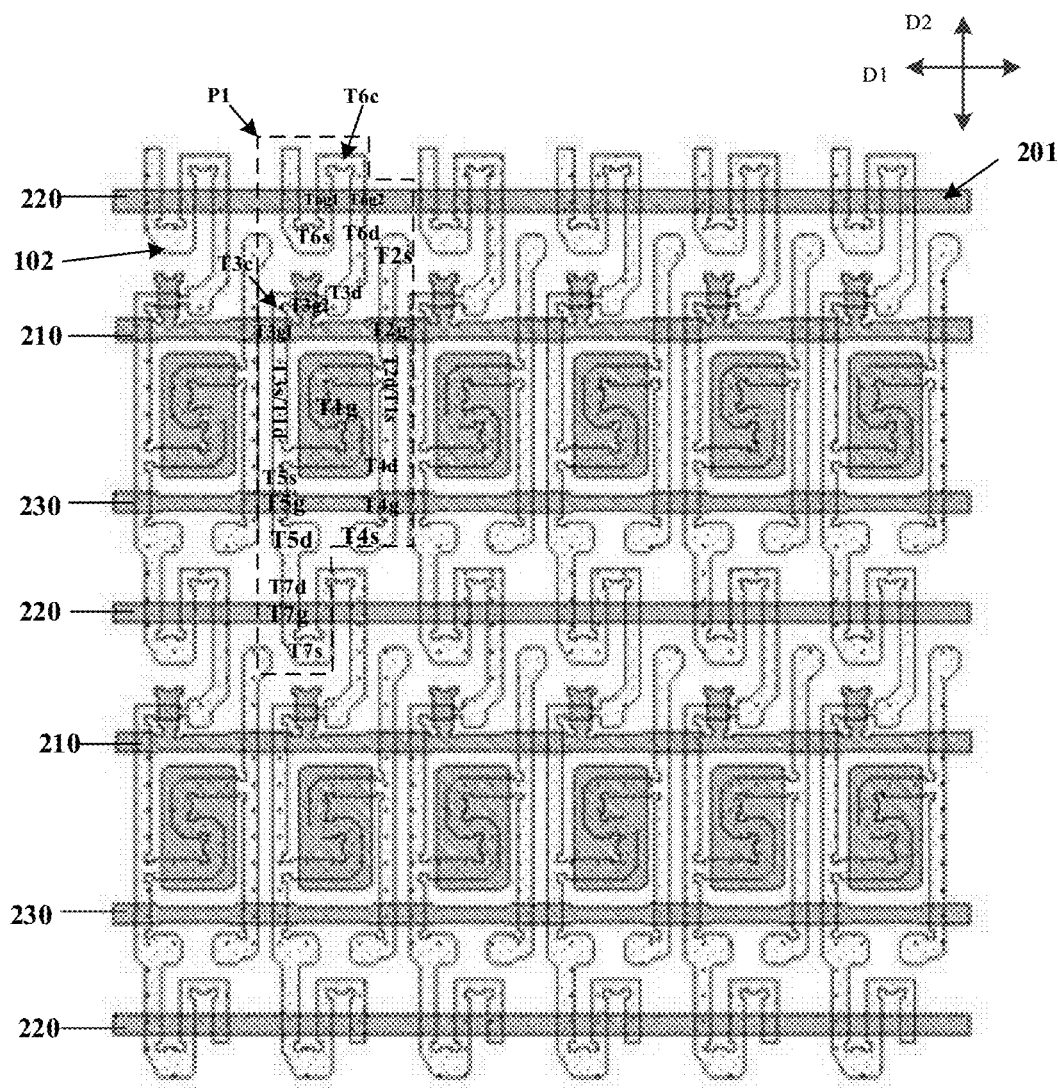
FIG. 5 is a fourth schematic diagram of a display substrate provided by at least one embodiment of the present disclosure.
Figure 6A:
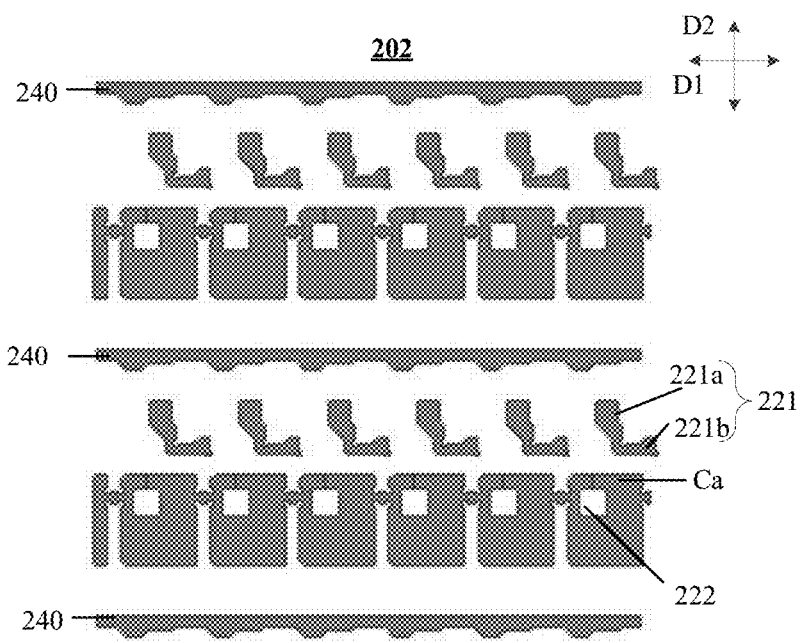
FIG. 6A is a fifth schematic diagram of a display substrate provided by at least one embodiment of the present disclosure.
Figure 6B:
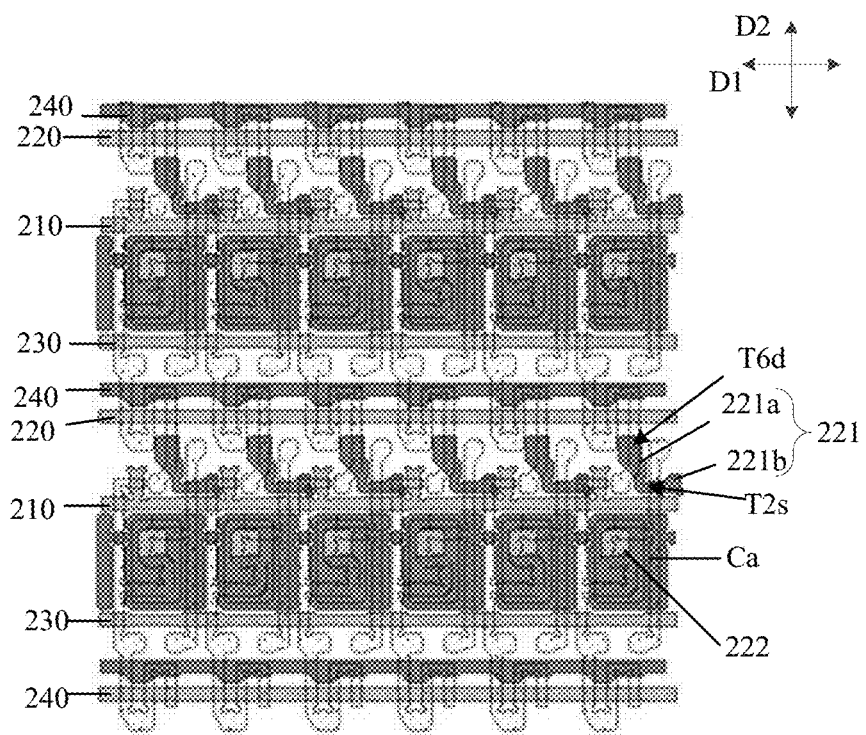
FIG. 6B is a sixth schematic diagram of a display substrate provided by at least one embodiment of the present disclosure.

FIG. 5 shows the semiconductor layer 102 and the first conductive layer 201 corresponding to FIG. 4A, FIG. 6A shows a pattern of the second conductive layer 202, FIG. 6B shows the second conductive layer 202 on the basis of FIG. 5; FIG. 7A shows the third conductive layer 203, and FIG. 7B shows the third conductive layer 203 on the basis of FIG. 6B; FIG. 8A shows the fourth conductive layer 204, and FIG. 8B shows the semiconductor layer 102, the first conductive layer 201 and the fourth conductive layer 204.

For the convenience of description, in the following description, Tng, Tns, Tnd, and Tna are used to represent a gate electrode, a first electrode, a second electrode and a channel region of the nth transistor Tn, respectively, where n is from 1 to 7.

It should be noted that, the "arranged in a same layer" stated in the present disclosure can refer to that, two (or more than two) structures are formed by a same deposition process and are patterned by a same patterning process, and the structures are not necessarily located in a same horizontal plane; and materials of these structures can be the same or different from each other. The "integrated structure" in the present disclosure can refer to a structure in which two (or more than two) sub-structures are formed by the same deposition process, patterned by the same patterning process and are connected with each other, and materials of these structures can be the same or different from each other.

For example, as shown in FIG. 5, the first conductive layer 201 includes the gate electrode of each of the transistors and some scanning lines and control lines. In FIG. 5, a region where the pixel circuit of the first sub-pixel P1 is located is schematically shown by a dashed box, and the gate electrodes, the first electrodes, the second electrodes and the channel regions of the first transistor T1 to the seventh transistor T7 in the first sub-pixel P1 are shown.

The semiconductor layer 102 includes active layers T1a to T7a of the first transistor T1 to the seventh transistor T7. As shown in FIG. 5, the active layer T1a to the active layer T7a of the first transistor T1 to the seventh transistor T7 respectively are connected with each other to form an integrated structure. For example, the semiconductor layers 20 of the sub-pixels in each column are connected with each other to form an integrated structure, and the semiconductor layers of the sub-pixels in two adjacent columns are spaced apart from each other.

For example, as shown in FIG. 5, the first conductive layer 201 includes the gate electrode T1g to the gate electrode T7g of the first transistor T1 to the seventh transistor T7. For example, the manufacture of the display substrate 20 adopts a self-alignment process, in which the first conductive layer 201 is used as a mask to conduct a convert-into-conductor treatment (for example, a doping treatment) on the semiconductor layer 102, so that a part of the semiconductor layer 102 not covered by the first conductive layer 201 becomes conductive; in this way, parts of the active layer of each transistors located at both sides of the channel region are converted to be conductive and form the first electrode and the second electrode of the transistor, respectively.

For example, as shown in FIG. 5, the third transistor T3 and the sixth transistor T6 respectively adopt a dual-gate structure including a first gate electrode and a second gate electrode, so that a gate control capability of the transistor can be improved, and a leakage current can be reduced. Since the third transistor T3 and the sixth transistor T6 both are transistors directly connected with the gate electrode (that is, the first node N1) of the first transistor T1 (that is, the driving transistor), the stability of the third transistor T3 and the sixth transistor T6 directly affects the stability of the gate (node N1) voltage of the first transistor T1. The dual-gate structure is utilized to improve the gate control capability of the third transistor T3 and the sixth transistor T6, which helps to reduce the leakage current of the transistors and thus helps to maintain the voltage of the node N1; in this way, the threshold voltage of the first transistor T1 can be fully compensated in the compensation stage, and hence the display uniformity of the display substrate in the light-emitting stage is improved.

As shown in FIG. 5, the third transistor T3 includes a first gate electrode T3g1 and a second gate electrode T3g2, as well as a first channel region and a second channel region respectively corresponding to the first gate electrode T3g1 and the second gate electrode T3g2; the first channel region and the second channel region are shielded by the first gate electrode T3g1 and the second gate electrode T3g2, respectively, and are not shown in FIG. 5. For example, the first gate electrode T3g1 is located on a main body of the scanning line 220 that controls the third transistor T3, and the second gate electrode T3g2 is a protrusion protruding from the main body of the scanning line 220 along the second direction D2. The third transistor T3 further includes a conductive region T3c located at the first gate electrode T3g1 and the second gate electrode T3g2, and the conductive region T3c is formed by converting the semiconductor layer exposed between the first gate electrode T3g1 and the second gate electrode T3g2 to be conductive. The conductive region T3c and the first electrode T3s of the third transistor T3 are separated by the first channel region of the third transistor T3, the conductive region T3c and the second electrode T3d of the third transistor T3 are separated by the second channel region of the third transistor T3; and the conductive region T3c as well as the first channel region and the second channel region of the third transistor T3 are formed into an integrated structure, for example, all of them include polysilicon materials. Similarly, the sixth transistor T6 further includes a conductive region T6c between the first gate electrode T6g1 and the second gate electrode T6g2.

For example, the first conductive layer 201 further includes a plurality of scanning lines 210, a plurality of reset control lines 220 and a plurality of light-emitting control lines 230 which are insulated from each other. All of these signal lines can be used as examples of the gate lines 11 shown in FIG. 3A.

The scanning line 210 is electrically connected with the gate electrode T2g of the second transistor T2 of the sub-pixels in a corresponding row (or an integrated structure) to provide a first scanning signal Ga1; the reset control line 220 is electrically connected with the gate electrode T6g of the sixth transistor T6 of the sub-pixels in a corresponding row to provide a first reset control signal Rst1; and the light-emitting control line 230 is electrically connected with the gate electrode T4g of the fourth transistor T4 of the sub-pixels in a corresponding row to provide a first light-emitting control signal EM1.

For example, as shown in FIG. 4, the scanning line 210 is also electrically connected with the gate electrode of the third transistor T3 to provide a second scanning signal Ga2, that is, the first scanning signal Ga1 and the second scanning signal Ga2 may be the same signal; the light-emitting control line 230 is also electrically connected with the gate electrode T5g of the fifth transistor T5 to provide a second light-emitting control signal EM2, that is, the first light-emitting control signal EM1 and the second light-emitting control signal EM2 are the same signal.

For example, the first gate electrode T3g1 extends along the first direction D1 and is a part of the scanning line 210. The second gate electrode T3g2 extends along the second direction D2, and is an extension part of the scanning line 210 extending along the second direction D2.

For example, as shown in FIG. 5, the gate electrode of the seventh transistor T7 of the pixel circuit in the current row is electrically connected with the reset control line 220 corresponding to the pixel circuit of the next row (that is, according to a scanning sequence of the scanning lines, the pixel circuit row where the scanning line to be turned on following the scanning line of the current pixel circuit row is located) to receive the second reset control signal Rst2.

For example, as shown in FIG. 6A, the second conductive layer 202 includes a first capacitor electrode Ca. The first capacitor electrode Ca is overlapped with the gate electrode T1g of the first transistor T1 in the direction perpendicular to the base substrate 101 to form a storage capacitor Cst, that is, the gate electrode T1g of the first transistor T1 serves as the second capacitor electrode Cb of the storage capacitor Cst. For example, the first capacitor electrode Ca includes an opening 222, and the opening 222 exposes at least a part of the gate electrode T1g of the first transistor T1, so that the gate electrode T1g is electrically connected with other structures. For example, the first capacitor electrodes Ca of the sub-pixels located in a same pixel row are connected with each other to form an integrated structure.

For example, the second conductive layer 202 may further include a plurality of reset voltage lines 240 extending along the first direction D1, and the plurality of reset voltage lines 240 are connected with the plurality of rows of sub-pixels in one-to-one correspondence. One of the reset voltage lines 240 is electrically connected with the first electrodes of the sixth transistors T6 of the corresponding row of sub-pixels to provide a first reset voltage Vinit1.

For example, as shown in FIG. 6B, the first electrodes of the seventh transistors T7 of the sub-pixels in the current row are electrically connected with the reset voltage line 240 corresponding to the sub-pixels in the next row to receive a second reset voltage Vinit2. This will be described in detail later in conjunction with FIG. 7B.

For example, as shown in FIG. 6A to FIG. 6B, the second conductive layer 202 may further include shielding electrodes 221. For example, the shielding electrode 221 is overlapped with the first electrode T2s of the second transistor T2 in the direction perpendicular to the base substrate 101 so as to protect the signal in the first electrodes T2s of the second transistors T2 from being disturbed by other signals. Since the first electrode T2s of the second transistor T2 is configured to receive the data signal Vd and since the data signal Vd determines the display grayscale of the sub-pixel, the shielding electrode 221 improves the stability of the data signal, so that the display performance is improved.

For example, with reference to FIG. 6B in combination with FIG. 5B, the shielding electrode 221 is also at least partially overlapped with the second electrode T6d of the sixth transistor T6 in the direction perpendicular to the base substrate 101 to improve the stability of the signal on the second electrode T6d, so that the stability of the sixth transistor T6 is improved, and the gate voltage of the first transistor T1 is further stabilized.

For example, with reference to FIG. 6B in combination with FIG. 5B, the shielding electrode 221 also extends to an adjacent sub-pixel and is at least partially overlapped with the conductive region T3c of the third transistor T3 in the adjacent sub-pixel in the direction perpendicular to the base substrate 101 to improve the stability of the signal in the conductive region T3c, so that the stability of the third transistor T3 is improved, and the gate voltage of the first transistor T1 is further stabilized.

For example, the shielding electrode 221 forms a stable capacitance with each of the first electrode T2s of the second transistor T2 and the second electrode T6d of the sixth transistor T6 which are opposite to (overlapped with) the shielding electrode 221. The shielding electrode 221 is configured to be loaded with a fixed voltage, and since the voltage difference across two ends of the capacitor cannot be abruptly changed, the stability of the voltage on the first electrode T2s of the second transistor T2, the conductive region T3c of the third transistor T3 and the second electrode T6d of the sixth transistor T6 are improved. For example, the shielding electrode 221 is electrically connected with the power supply line 250 in the third conductive layer 203 to be loaded with the first power supply voltage VDD.

For example, as shown in FIG. 6A to FIG. 6B, the shielding electrode 221 is in a shape of an "L" or is in a shape of a "V", and includes a first branch 221a and a second branch 221b with different extension directions. The first branch 221a is at least partially overlapped with the second electrode T6d of the sixth transistor T6 in the direction perpendicular to the base substrate 101; the second branch 221b is at least partially overlapped with the first electrode T2s of the second transistor T2 and the conductive region T3c of the third transistor T3 of the adjacent sub-pixel in the direction perpendicular to the base substrate 101, so that the conductive region T3 is shielded to improve the stability of the transistor. For example, the first branch 221a extends along the second direction D2, and the second branch 221b extends along the first direction D1.

For example, as shown in FIG. 7A to FIG. 7B, the third conductive layer 203 includes a plurality of power supply lines 250 extending along the second direction D2, and the plurality of power supply lines 250 are connected with the first voltage terminal VDD to transmit the first power supply voltage VDD. For example, the plurality of power supply lines 250 are electrically connected with the plurality of columns of sub-pixels in one-to-one correspondence to provide the first power supply voltage VDD. Each of the power supply lines 250 is electrically connected with the first capacitor electrodes Ca of the sub-pixels in the corresponding column through a via hole 342, and the power supply line 250 is electrically connected with the first electrodes T4s of the fourth transistors T4 through a via hole 343. For example, the power supply line 250 is also electrically connected with the shielding electrode 221 through a via hole 341, so that the shielding electrode 221 has a fixed potential and the shielding ability of the shielding electrode is improved. For example, the via hole 342 and the via hole 341 both penetrate through the third insulating layer 303, and the via hole 343 penetrates through the first insulating layer 301, the second insulating layer 302 and the third insulating layer 303.

For example, the third conductive layer 203 further includes a plurality of data lines 12 extending along the second direction D2. For example, the plurality of data lines 12 are electrically connected with the plurality of columns of sub-pixels in one-to-one correspondence to provide the data signal Vd. For example, the data line 12 is electrically connected with the first electrodes T2s of the second transistors T2 of the sub-pixels in the corresponding column through the via hole 346 to provide data signals. For example, the via hole 346 penetrates through the first insulating layer 301, the second insulating layer 302 and the third insulating layer 303.

For example, with reference to FIG. 4A to FIG. 4B in combination with FIG. 7A to FIG. 7B, the third conductive layer 203 further includes connection electrodes 231, one end of the connection electrode 231 is electrically connected with the gate electrode T1g of the first transistor T1, that is, the second capacitor electrode Cb, through the opening 222 in the first capacitor electrode Ca and the via hole 344 in the insulating layer, the other end of the connection electrode 231 is electrically connected with the second electrode T3d of the third transistor T3 through the via hole 345, so that the second capacitor electrode Cb is electrically connected with the second electrode T3d of the third transistor T3. For example, the via hole 344 penetrates through the second insulating layer 302 and the third insulating layer 303. For example, the via hole 345 penetrates through the first insulating layer 301, the second insulating layer 302 and the third insulating layer 303.

For example, with reference to FIG. 4A to FIG. 4B in combination with FIG. 7A to FIG. 7B, the third conductive layer 203 further includes connection electrodes 232, each of the connection electrodes 233 is electrically connected with the second electrode T5d of the fifth transistor T5 through the via hole 349, for electrically connecting the second electrodes T5d of the fifth transistors T5 with the pixel electrode 134 of the light-emitting element through the via hole 350. For example, the via hole 349 penetrates through the first insulating layer 301, the second insulating layer 302 and the third insulating layer 303.

For example, as shown in FIG. 7A to FIG. 7B, the third conductive layer 203 further includes connection electrodes 233, one end of each of the connection electrodes 233 is electrically connected with the reset voltage line 240 through the via hole 348, the other end of the connection electrode 233 is electrically connected with the first electrode T6s of the sixth transistor T6 through the via hole 347, so that the first electrode T6s of the sixth transistor T6 can receive a first reset voltage Vinit1 from the reset voltage line 240. For example, the via hole 348 penetrates through the third insulating layer 303. For example, the via hole 347 penetrates through the first insulating layer 301, the second insulating layer 302 and the third insulating layer 303.

For example, as shown in FIG. 7B, the first electrode of the seventh transistor T7 of the sub-pixel in the previous row is electrically connected with the first electrode of the sixth transistor T6 of the sub-pixel in the current row, and is electrically connected with the reset voltage line 240 corresponding to the sub-pixels in the current row (that is, the reset voltage line 240 at the top in FIG. 7B) to receive a second reset voltage Vinit2; the first electrode of the seventh transistor T7 of the sub-pixel in the current row is electrically connected with the first electrode of the sixth transistor T6 of the sub-pixel in the next row, and is electrically connected with the reset voltage line 240 corresponding to the sub-pixels in the next row (that is, the reset voltage line 240 in the middle of FIG. 7B) to receive a second reset voltage Vinit2.

In order to facilitate the description of the relative positional relationships among the pixel electrodes of the light-emitting elements, and the gate electrodes and channel regions of the respective transistors in the embodiments of the present disclosure, FIG. 8B shows the semiconductor layer 102, the first conductive layer 201 and the fourth conductive layer 204.

With reference to FIG. 4A to FIG. 4C and FIG. 8A to FIG. 8B, the fourth conductive layer 204 includes a first electrode of the light-emitting element, that is, a pixel electrode 134, for example, the fourth conductive layer 204 includes a pixel electrode 134a of the first sub-pixel 100a, a pixel electrode 134b of the second sub-pixel 100b, and a pixel electrode 134c of the third sub-pixel 100c. The pixel electrode 134 of each sub-pixel is electrically connected with the connection electrode 232 of the sub-pixel through the via hole 350, so that the pixel electrode 134 is electrically connected with the second electrode T5d of the fifth transistor T5 through the connection electrode 233. The via hole 350, for example, penetrates through the fourth insulating layer 304.

For example, with reference to FIG. 4A to FIG. 4C, the display substrate 20 may further include a pixel defining layer 305 on the pixel electrodes of the light-emitting elements. Openings are formed in the pixel defining layer 305 to expose at least parts of the pixel electrodes 134 to define opening regions (that is, effective light-emitting regions) 600 of the sub-pixels of the display substrate. The organic functional layer 136 of the light-emitting element 120 is at least formed in the opening, and the second electrode 135 is formed on the organic functional layer 136 to form the light-emitting element 120. For example, the second electrode 135 is a common electrode, and an entire surface of the common electrode is arranged on the display substrate 20. For example, the pixel electrode 134 is an anode of the light-emitting element, and the second electrode 135 is a cathode of the light-emitting element. FIG. 8B schematically shows the opening regions 600 of the first sub-pixel P1, the second sub-pixel P2 and the third sub-pixel P3 with polygons, which is not limited in the present disclosure.

With reference to FIG. 4A to FIG. 4B and FIG. 8A to FIG. 8B, each of the pixel electrodes 134 includes an main electrode part 140 and a first electrode extension part 142 extending from the main electrode part 140, the main electrode part 140 is configured to contact the organic functional layer of the light-emitting element, the first electrode extension part 142 is configured to be electrically connected with the connection electrode 232 through a via hole 350 (an example of the first via hole of the present disclosure); the main electrode part 140 and the via hole 350 are not overlapped in the direction perpendicular to the base substrate, so that the flatness of the main electrode part 140 is prevented from being affected by the via hole 350; the main electrode part 140 is configured to drive the organic functional layer of the light-emitting element to emit light, for example, the main electrode part 140 is in direct contact with the organic functional layer of the light-emitting element, as a result, an unevenness of the main electrode part 140 not only affects the luminous efficiency of the luminescent material, but also causes color shift. For example, the main electrode part 140 is a part of the pixel electrode 134 exposed by the opening region (for example, an opening region 600 hereinafter) in the pixel defining layer. The relative positions of the via hole 350 and the pixel electrode 134 are schematically shown by a rectangular block in FIG. 8B. For example, the first electrode extension part 141 extends from the main electrode part 140 along the second direction D2.

For example, in the embodiment of the present disclosure, the main electrode part of the pixel electrode may refer to a portion of the pixel electrode that is overlapped with the corresponding organic functional layer 136 in the direction perpendicular to the base substrate, or is a portion of the pixel electrode overlapped with the corresponding opening region 600 in the direction perpendicular to the base substrate, or is a regular-shaped region with the largest area of the pixel electrode.

With reference to FIG. 4A to FIG. 4B in combination with FIG. 5 and FIG. 8A to FIG. 8B, for example, six sub-pixels in each row of sub-pixels may be divided into two pixel groups, that is, a first pixel group and a second pixel group; each of the pixel groups includes three sub-pixels, and the three sub-pixels are configured to emit light of three basic colors (RGB), for example, each of the pixel groups is configured to emit full color light.

As shown in FIG. 8A to FIG. 8B, in each of the pixel groups, three sub-pixels are arranged side by side along the first direction D1, that is, the pixel circuits of the three sub-pixels are located in the same row; the main electrode parts of the pixel electrodes of the three sub-pixels are arranged in a triangle, and such arrangement mode can effectively improve the aperture ratio of the display substrate. In the first direction D1, the triangle constituted by the main electrode parts of the pixel electrodes of the three sub-pixels in one pixel group is inverted relative to the triangle constituted by the main electrode parts of the pixel electrodes of the three sub-pixels in the adjacent pixel group.

With reference to FIG. 4A to FIG. 4B in combination with FIG. 5 and FIG. 8A to FIG. 8B, a first sub-pixel P1, a second sub-pixel P2 and a third sub-pixel P3 constitute a first pixel group, the first sub-pixel P1, the second sub-pixel P2 and the third sub-pixel P3 are arranged along the first direction D1, and the second sub-pixel P2 and the third sub-pixel P3 are located at two sides of the first sub-pixel P1. The second pixel group includes a sixth sub-pixel P6, a seventh sub-pixel P7 and an eighth sub-pixel P8, the sixth sub-pixel P6 and the first sub-pixel P1 are configured to emit light of a same color, such as green light; the seventh sub-pixel P7 and the second sub-pixel P2 are configured to emit light of a same color, for example, red light; and the eighth sub-pixel P8 and the third sub-pixel P3 are configured to emit light of a same color, for example, blue light.

As shown in FIG. 8B, the main electrode parts 140 of the pixel electrodes of the sub-pixels of the same color in the first pixel group and the second pixel group are not overlapped in the second direction.

For example, the pixel electrodes of the sub-pixels in the first pixel group and the second pixel group are overlapped with each other in the second direction. The pixel electrodes of each row of the sub-pixels are overlapped with each other in the second direction D2.

The pixel electrode 134b of the second sub-pixel P2 and the pixel electrode 134c of the third sub-pixel P3 are arranged side by side in the first direction D1, and the first electrode extension part 141 of the pixel electrode 134a of the first sub-pixel P1 is located between the pixel electrode 134b of the second sub-pixel P2 and the pixel electrode 134c of the third sub-pixel P3. Since a space between the pixel electrode 134b of the second sub-pixel P2 and the pixel electrode 134c of the third sub-pixel P3 is limited, the main electrode part 140 of the pixel electrode of the first sub-pixel P1 is moved to the bottom and arranged to be staggered, which results in that the main electrode part 140 of the pixel electrode of the first sub-pixel P1 and the control electrode (that is, the gate electrode T1g of the first transistor T1) of the driving sub-circuit of the first sub-pixel P1 are not overlapped in the direction perpendicular to the base substrate.

With reference to FIG. 5 in combination with FIG. 8B, the main electrode part 140 of the pixel electrode 134b of the second sub-pixel P2 is at least partially overlapped with the control electrode (that is, the gate electrode T1g of the first transistor T1) of the driving sub-circuit of the second sub-pixel P2 in the direction perpendicular to the base substrate. The main electrode part 140 of the pixel electrode 134c of the third sub-pixel P3 is at least partially overlapped with the control electrode (that is, the gate electrode T1g of the first transistor T1) of the driving sub-circuit of the third sub-pixel P3 in the direction perpendicular to the base substrate.

The main electrode part 140 of the pixel electrode 134a of the first sub-pixel P1 is not overlapped with the control electrode of the driving sub-circuit of the first sub-pixel P1 (that is, the gate electrode T1g of the first transistor T1) in the direction perpendicular to the base substrate, and the first electrode extension part 141 of the pixel electrode 134a of the first sub-pixel P1 is at least partially overlapped with the control electrode of the driving sub-circuit of the first sub-pixel P1 (that is, the gate electrode T1g of the first transistor T1) in the direction perpendicular to the base substrate, that is, the first sub-pixel is one of the first type of sub-pixels.

By arranging the first electrode extension part 141 of the pixel electrode 134a of the first sub-pixel P1 to be overlapped with the gate electrode T1g of the first transistor T1 of the first sub-pixel P1, the parasitic capacitance between the first node N1 and the fourth node N4 is the same for all the sub-pixels, so that the uniformity of the display is improved.

For example, With reference to FIG. 5 and FIG. 8B, for any two sub-pixels adjacent in the first direction D1, an main electrode part of one sub-pixel and a control electrode of a driving sub-circuit of the one sub-pixel are overlapped in the direction perpendicular to the base substrate, that is, the one sub-pixel belongs to the second type of sub-pixels; an main electrode part of the other sub-pixel and the control electrode of the driving sub-circuit of the other sub-pixel are not overlapped in the direction perpendicular to the base substrate, but the electrode extension part of the main electrode part of the other sub-pixel is overlapped with the control electrode of the driving sub-circuit of the other sub-pixel, that is, the other sub-pixel belongs to the first type of sub-pixels. Such arrangement improves the uniformity of distribution of parasitic capacitances while increasing the aperture ratio of the display substrate, thereby improving the uniformity of the display.

As shown in FIG. 8B, an orthographic projection of the via hole 350 in the first sub-pixel on the base substrate is located between an orthographic projection of the main electrode part 140 of the pixel electrode 134a of the first sub-pixel on the base substrate and an orthographic projection of the control electrode T1g of the driving sub-circuit of the pixel circuit of the first sub-pixel on the base substrate, in the second direction D2.

As shown in FIG. 8B, the main electrode parts of the sub-pixels that emit light of the same color in the first pixel group and the second pixel group are not located in the same row. For example, in the second pixel group, the main electrode part of the sub-pixel (that is, the sixth sub-pixel P6) that emits light of a same color as the first sub-pixel and the control electrode (that is, the gate electrode T1g of the first transistor T1) of the driving sub-circuit of the sub-pixel are at least partially overlapped in the direction perpendicular to the base substrate.

The inventors found that since the third transistor T3 and the sixth transistor T6 are the transistors directly connected with the gate electrode (that is, the first node N1) of the first transistor T1 (that is, the driving transistor), the stability of the third transistor T3 and the sixth transistor T6 directly affects the stability of the voltage at the gate electrode (the node N1) of the first transistor T1. Since materials of the channel regions of the third transistor and the sixth transistor both include semiconductor materials, unstable phenomena such as threshold shift and current leakage are prone to occur under illumination. Although the channel regions have been shielded by the respective gate electrodes, the light-shielding effect needs to be improved due to, for example, a poor light-shielding property or a small thickness of the materials of the gate electrodes. At least one embodiment of the present disclosure further improves the light-shielding effect of the channel regions by designing the pixel electrode to shield the channel regions of the third transistor and the sixth transistor of each sub-pixel, so that the stability of the transistors is enhanced, and the display quality is improved.

With reference to FIG. 4B, FIG. 5 and FIG. 8A to FIG. 8B, the pixel electrode 134a of the first sub-pixel P1 further includes a second electrode extension part 142 extending from the main electrode part 140, the second electrode extension part 142 is at least partially overlapped with the first control electrode (that is, the first gate electrode T3g1 of the third transistor) and the second control electrode (that is, the second gate electrode T3g2 of the third transistor) of the compensation sub-circuit of the pixel circuit of the fifth sub-pixel P5, respectively; and the fifth sub-pixel P5 is adjacent to the first sub-pixel P1 in the second direction D2. As shown in FIG. 8, the fifth sub-pixel P5 and the first sub-pixel P1 are located in a same column, and the fifth sub-pixel P5 is located below the first sub-pixel P1. For example, the second electrode extension part 142 extends from the main electrode part 140 along the second direction D2.

Since the channel region is located just below the gate electrode, the second electrode extension part 142 is overlapped with the first channel region T3a1 and the second channel region T3a1 of the third transistor by arranging the second electrode extension part 142 to be at least partially overlapped with the first gate electrode and the second gate electrode of the third transistor, so that the first channel region T3a1 and the second channel region T3a1 are shielded. For example, the gate electrode of the transistor can be understood as a part of a gate line that is overlapped with a corresponding channel region in the direction perpendicular to the base substrate.

For example, referring to FIG. 4B, FIG. 5 and FIG. 8B, an orthographic projection of the second electrode extension part 142 on the base substrate covers orthographic projections of the first gate electrode T3g1 and the second gate electrode T3g2 of the third transistor on the base substrate, that is, covering orthographic projections of the first channel region T3a1 and the second channel region T3a1 of the third transistor on the base substrate. In this way, the first channel region T3a1 and the second channel region T3a1 can be completely shielded, thereby achieving a better light shielding effect.

For example, with reference to FIG. 4C, FIG. 5 and FIG. 8B, the pixel electrode 134a of the first sub-pixel is at least partially overlapped with the first control electrode and the second control electrode (that is, the first gate electrode T6g1 and the second gate electrode T6g2 of the sixth transistor T6) of the reset sub-circuit of the first sub-pixel, respectively.

For example, the orthographic projection of the pixel electrode 134a of the first sub-pixel on the base substrate covers orthographic projections of the first gate electrode T6g1 and the second gate electrode T6g2 of the sixth transistor on the base substrate, that is, covering the orthographic projections of the first channel region T6a1 and the second channel region T6a1 of the third transistor on the base substrate. In this way, the first channel region T6a1 and the second channel region T6a1 can be completely shielded, thereby achieving a better light shielding effect.

For example, with reference to FIG. 4C, FIG. 5 and FIG. 8B, the pixel electrode 134a of the first sub-pixel further includes a third electrode extension part 143 extending from the main electrode part 140, the third electrode extension part 143 is at least partially overlapped with at least one of or both of the first control electrode and the second control electrode (that is, the first gate electrode T6g1 and the second gate electrode T6g2 of the sixth transistor T6) of the reset sub-circuit of the second sub-pixel. For example, the third electrode extension part 143 extends from the main electrode part 140 along the first direction D1.

For example, the orthographic projection of the pixel electrode 134a of the first sub-pixel on the base substrate covers orthographic projections of the first gate electrode T6g1 and the second gate electrode T6g2 of the sixth transistor in the second sub-pixel on the base substrate, that is, covering the orthographic projections of the first channel region T6a1 and the second channel region T6a1 of the third transistor on the base substrate. In this way, the first channel region T6a1 and the second channel region T6a1 can be completely shielded, thereby achieving a better light shielding effect.

For example, the orthographic projection of the pixel electrode 134a of the first sub-pixel on the base substrate covers orthographic projections of the first gate electrode T6g1 and the second gate electrode T6g2 of the sixth transistor in the second sub-pixel on the base substrate, that is, covering the orthographic projections of the first channel region T6a1 and the second channel region T6a1 of the sixth transistor on the base substrate. In this way, the first channel region T6a1 and the second channel region T6a1 can be completely shielded, thereby achieving a better light shielding effect.

For example, referring to FIG. 4B, FIG. 5 and FIG. 8B, the first control electrode (that is, the first gate electrode T3g1 of the third transistor) and the second control electrode (that is, the second gate electrode T3g2 of the third transistor) of the compensation sub-circuit of the pixel circuit of the first sub-pixel respectively are blocked by the pixel electrode of the sub-pixel (that is, the ninth sub-pixel) directly above the first sub-pixel.

For example, as shown in FIG. 8B, the pixel electrode 134b of the second sub-pixel further includes a second electrode extension part 142 extending from the main electrode part 140, the second electrode extension part 142 is at least partially overlapped with the control electrode of the driving sub-circuit of the fourth sub-pixel P4. The fourth sub-pixel P4 is adjacent to the second sub-pixel P2 in the first direction D1, and the fourth sub-pixel and the first sub-pixel are respectively located at two sides of the second sub-pixel.

As shown in FIG. 8B, a relative position of the pixel electrode 134b of the second sub-pixel in the pixel circuit may refer to a relative position of the pixel electrode of the tenth sub-pixel P10. The tenth sub-pixel P10 is located at a side of the eighth sub-pixel P8 away from the sixth sub-pixel P6; the electrode extension part of the pixel electrode of the tenth sub-pixel P10 and the control electrode of the driving sub-circuit of the eighth sub-pixel P8 are at least partially overlapped in a direction perpendicular to the base substrate.

As shown in FIG. 8B, since an overlapping area of the pixel electrode of the eighth sub-pixel P8 and the control electrode of the driving sub-circuit of the eighth sub-pixel is limited, the parasitic capacitance on the first node N1 can be increased by arranging the pixel electrode of the tenth sub-pixel P10 to be overlapped with the gate electrode T1g of the driving transistor of the eighth sub-pixel, thereby improving the distribution uniformity of parasitic capacitance.

Figure 8C:
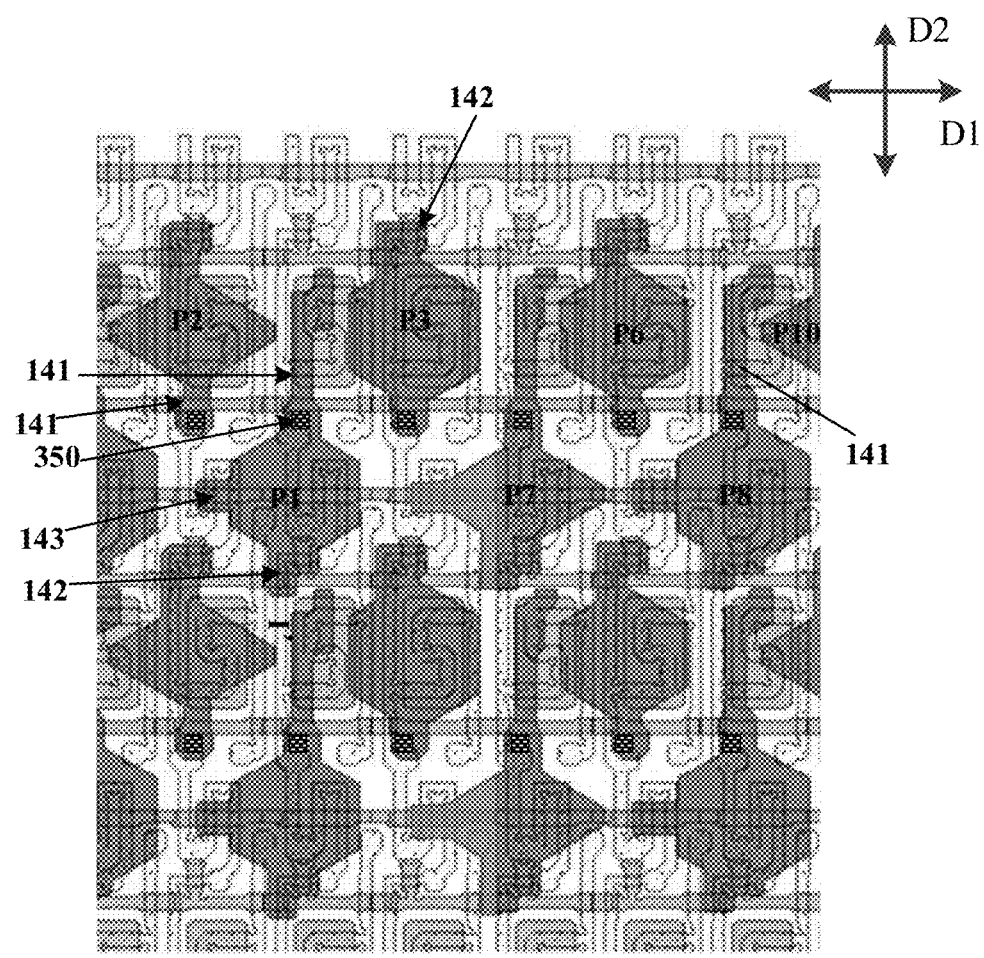
FIG. 8C is an eleventh schematic diagram of a display substrate provided by at least one embodiment of the present disclosure.

In some other examples, the first electrode extension part 141 of the eighth sub-pixel P8 may also have a larger area, so that a larger overlapping area with the control electrode of the driving sub-circuit of the eighth sub-pixel P8 is provided. For example, as shown in FIG. 8C, the first electrode extension part 141 of the eighth sub-pixel P8 extends by a longer distance, and is overlapped with an upper half part of the control electrode of the driving sub-circuit of the eighth sub-pixel P8. Although the pixel electrode of the tenth sub-pixel P10 adjacent thereto is still overlapped with the control electrode of the driving sub-circuit of the eighth sub-pixel P8, the overlapping area is small, so that the parasitic capacitance formed between the pixel electrode of the eighth sub-pixel P8 itself and the control electrode of the driving sub-circuit is dominant; since the third sub-pixels P3 of a same color also form parasitic capacitance by their own pixel electrodes, this arrangement improves the uniformity among sub-pixels of the same color.

For example, referring to FIG. 5 and FIG. 8B, the pixel electrode 134b of the second sub-pixel further includes a third electrode extension part 143 extending from the main electrode part 140, and the third electrode extension part 143 is at least partially overlapped with the first control electrode (that is, the first gate electrode T3g1 of the third transistor) and the second control electrode (that is, the second gate electrode T3g2 of the third transistor) of the compensation sub-circuit of the second sub-pixel, respectively.

For example, an orthographic projection of the third electrode extension part 143 on the base substrate covers the orthographic projections of the first gate electrode T3g1 and the second gate electrode T3g2 of the third transistor in the second sub-pixel on the base substrate, that is, covering the orthographic projections of the first channel region T3a1 and the second channel region T3a1 of the third transistor on the base substrate. In this way, the first channel region T3a1 and the second channel region T3a1 can be completely shielded, thereby achieving a better light shielding effect.

For example, as shown in FIG. 8B, the pixel electrode 134c of the third sub-pixel is also at least partially overlapped with the control electrode (that is, the gate electrode T1g of the first transistor T1) of the driving sub-circuit of the first sub-pixel in the direction perpendicular to the base substrate.

Due to a limited space between the pixel electrode 134b of the second sub-pixel P2 and the pixel electrode 134c of the third sub-pixel P3, an area of the first electrode extension part 141 of the pixel electrode 134c of the first sub-pixel P1 is limited, so that an overlapping area of the first electrode extension part 134 and the gate electrode T1g of the first transistor T1 in the direction perpendicular to the base substrate is limited, while an sufficient parasitic capacitance cannot be obtained on the first node N1. By arranging the pixel electrode of the third sub-pixel to be overlapped with the gate electrode T1g of the driving transistor of the first sub-pixel, the parasitic capacitance on the first node N1 can be increased, thereby improving the distribution uniformity of the parasitic capacitance.

For example, as shown in FIG. 8B, the pixel electrode 134c of the third sub-pixel further includes a second electrode extension part 142 extending from the main electrode part 140 of the third sub-pixel, and the second electrode extension part is at least partially overlapped with the first control electrode (that is, the first gate electrode T3g1 of the third transistor) and the second control electrode (that is, the second gate electrode T3g2 of the third transistor) of the compensation sub-circuit of the pixel circuit of the third sub-pixel, respectively.

For example, referring to FIG. 5 and FIG. 8B, the orthographic projection of the second electrode extension part 142 on the base substrate covers the orthographic projections of the first gate electrode T3g1 and the second gate electrode T3g2 of the third transistor on the base substrate, that is, covering the orthographic projections of the first channel region T3a1 and the second channel region T3a1 of the third transistor on the base substrate. In this way, the first channel region T3a1 and the second channel region T3a1 can be completely shielded, thereby achieving a better light shielding effect.

As shown in FIG. 8A to FIG. 8B, the main electrode parts 140 of the pixel electrodes 134 of the plurality of sub-pixels are arranged in a plurality of pixel electrode rows along the first direction D1 and a plurality of pixel electrode columns along the second direction D2, in which a distribution of the odd-numbered rows is the same, and a distribution of the even-numbered rows is the same, the main electrode parts in the odd-numbered rows and in the even-numbered rows are staggered from each other, that is, the main electrode part in the odd-numbered row is located between two adjacent main electrode parts in the even-numbered row along the first direction, and the main electrode part in the even-numbered row is located between adjacent two main electrode parts in the odd-numbered row along the first direction. The sub-pixels to which the main electrode parts located in a same column belong emit light of a same color.

For example, as shown in FIG. 8A to FIG. 8B, the plurality of pixel electrode rows include the first pixel electrode row and the second pixel electrode row that are adjacent, the sub-pixels including the main electrode parts in the first pixel electrode row belong to the first type of sub-pixels, and the sub-pixels including the main electrode parts in the second pixel electrode row belong to the second type of sub-pixels.

For example, as shown in FIG. 8A to FIG. 8B, in the second direction, the via hole 350 of each sub-pixel including each main electrode part of the plurality of main electrode parts in the first pixel electrode row is located at a side of the each pixel main electrode part close to the second pixel electrode row, and the via hole 350 of each sub-pixel including each main electrode part of the plurality of main electrode parts in the second pixel electrode row is located at a side of the each pixel main electrode part close to the first pixel electrode row. For example, as shown in FIG. 8A to FIG. 8B, the via holes 350 corresponding to the first pixel electrode row and the via holes 350 corresponding to the second pixel electrode row, that is, the via holes 350 in each row of sub-pixels, are basically arranged in a straight line, and the straight line extends along the first direction D1. For example, orthographic projections of the via holes 350 in the row of sub-pixels on the base substrate are at least partially overlapped with the orthographic projection of the light-emitting control line 350 correspondingly connected with the row of sub-pixels on the base substrate.

As shown in FIG. 8A to FIG. 8B, for any two adjacent rows of main electrode parts, the pixel electrode including each main electrode part in one row (for example, in the row where the main electrode part of the second sub-pixel P2 is located, as shown in FIG. 8) is at least partially overlapped with the sub-pixel including the each main electrode part and the control electrode of the driving sub-circuit of another sub-pixel (for example, the sub-pixels on the left side of the sub-pixels in FIG. 8) adjacent to the discussed sub-pixel in the first direction, respectively, along the direction perpendicular to the base substrate; the pixel electrode including each main electrode part in the other row (for example, the row where the main electrode part of the first sub-pixel P1 is located, as shown in FIG. 8A to FIG. 8B) is, in the direction perpendicular to the base substrate, at least partially overlapped with the sub-pixel including the main electrode part and least partially overlapped with the first control electrode and the second control electrode of the first reset sub-circuit of another sub-pixel (for example, the sub-pixel at the left side of the discussed sub-pixel, as shown in FIG. 8) in another column along the first direction, respectively; in other words, the sub-pixels including the main electrode parts in one row of any two adjacent rows of main electrode parts belong to the first type of sub-pixels, and the sub-pixels including the main electrode parts in the other row of the any two adjacent rows belong to the second type of sub-pixels.

For example, the base substrate 101 may be a rigid substrate, such as a glass substrate and a silicon substrate, and the base substrate 101 can also be formed of flexible materials with excellent heat resistance and durability, such as polyimide (PI), polycarbonate (PC), polyethylene terephthalate (PET), polyethylene, polyacrylate, polyarylate, polyetherimide, polyether sulfone, polyethylene glycol terephthalate (PET), polyethylene (PE), polypropylene (PP), polysulfone (PSF), polymethyl methacrylate (PMMA), triacetate cellulose (TAC), cyclic olefin polymers (COP) and cyclic olefin copolymers (COC).

For example, materials of the semiconductor layer 102 include but are not limited to the silicon-based materials (amorphous silicon a-Si, and polycrystalline silicon p-Si), metal oxide semiconductors (IGZO, ZnO, AZO, and IZTO) and organic materials (hexathiophene and polythiophene).

For example, materials of the first conductive layer to the fourth conductive layer may include gold (Au), silver (Ag), copper (Cu), aluminum (Al), molybdenum (Mo), magnesium (Mg), tungsten (W) and alloy materials composed of the above metals; or conductive metal oxide materials, such as indium tin oxide (ITO), indium zinc oxide (IZO), zinc oxide (ZnO), and zinc aluminum oxide (AZO).

For example, the light-emitting element 120 has a top emission structure, the first electrode (that is, the pixel electrode) 134 is reflective and the second electrode 135 is transmissive or semi-transmissive. For example, the first electrode 134 is an anode, and the second electrode 135 is a cathode. For example, the first electrode 134 is an ITO/Ag/ITO stacked structure, the transparent conductive material ITO is a material with high work function, and the transparent conductive material ITO directly contacts with the light-emitting material so as to improve the hole injection rate. The metal material Ag helps to improve the reflectivity of the first electrode. For example, the second electrode 135 is made of materials with a low work function to act as a cathode, for example, the second electrode 135 is made of a semi-transmissive metal or metal alloy material, such as an Ag/Mg alloy material.

For example, the first insulating layer 301, the second insulating layer 302, and the third insulating layer 303 are, for example, inorganic insulating layers made of, for example, oxides of silicon such as silicon oxide, nitrides of silicon such as silicon nitride, and oxynitrides of silicon such silicon oxynitride, or metal oxynitride insulating materials such as aluminum oxide and titanium nitride. For example, the fourth insulating layer 304 and the pixel defining layer 305 are respectively of organic insulating materials, for example, polyimide (PI), acrylate, epoxy resin, polymethyl methacrylate (PMMA) and other organic insulating materials. For example, the fourth insulating layer 304 is a planarization layer; for example, the material of the fourth insulating layer 304 is a photoresist material.

At least one embodiment of the present disclosure further provides a display panel including any one of the above display substrates 20. For example, the display panel is an OLED display panel, and correspondingly the display substrate 20 included in the display panel is an OLED display substrate. The display substrate 20 may include the light-emitting elements, or may not include the light-emitting elements, that is, the light-emitting elements can be formed in a panel factory after the display substrate 20 is formed. In the case where the display substrate 20 itself does not include the light-emitting elements, the display panel provided by the embodiments of the present disclosure further includes the light-emitting elements in addition to the display substrate 20.

Figure 9:
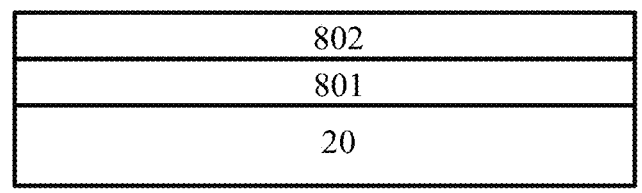
FIG. 9 is a schematic diagram of a display panel provided by at least one embodiment of the present disclosure.

As shown in FIG. 9, for example, the display panel 30 further includes an encapsulation layer 801 and a cover plate 802 arranged on the display substrate 20, the encapsulation layer 801 is configured to seal the light-emitting elements on the display substrate 20 to prevent the outside moisture and oxygen from penetrating into the light-emitting elements and the driving sub-circuits which may cause damages to the device. For example, the encapsulation layer 801 includes an organic thin film or a structure in which inorganic thin films, organic thin films, and inorganic thin films are alternately stacked. For example, a water absorbing layer (not shown) may also be arranged between the encapsulation layer 801 and the display substrate 20, and the water absorbing layer is configured to absorb residual water vapor or sol in the pre-fabrication process of the light-emitting elements. The cover plate 802 is, for example, a glass cover plate or a flexible cover plate. For example, the cover plate 802 and the encapsulation layer 801 may be an integrated structure.

Figure 10:
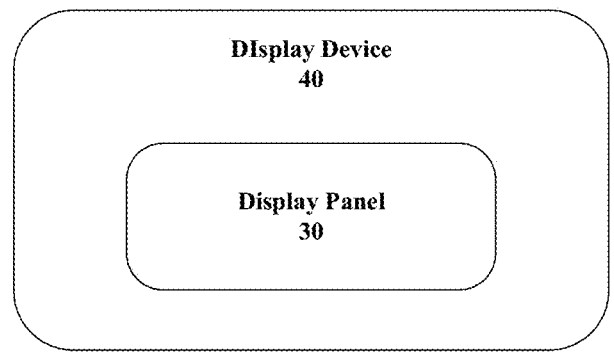
FIG. 10 is a schematic diagram of a display device provided by at least one embodiment of the present disclosure.

At least one embodiment of the present disclosure further provides a display device 40, as shown in FIG. 10, the display device 40 includes any one of the above-mentioned display substrates 20 or display panels 30, the display device in the present embodiment may be any product or component with a display function, such as a displayer, an OLED panel, an OLED TV, an electronic paper, a mobile phone, a tablet computer, a notebook computer, a digital photo frame, and a navigator.

What are described above is related to only the illustrative embodiments of the present disclosure and not limitative to the protection scope of the present application. Therefore, the protection scope of the present application shall be defined by the accompanying claims.

The invention claimed is:

1. A display substrate, comprising:
a base substrate; and
a plurality of sub-pixels distributed on the base substrate, wherein the plurality of sub-pixels are arranged in a plurality of sub-pixel rows along a first direction and a plurality of sub-pixel columns along a second direction, and the first direction intersects with the second direction; wherein
for each sub-pixel row among the plurality of sub-pixel rows, two adjacent sub-pixels are configured to emit light of different colors, and each sub-pixel and an adjacent sub-pixel in an adjacent sub-pixel row are configured to emit light of different colors,
at least two adjacent sub-pixel rows among the plurality of sub-pixel rows comprise a first sub-pixel row and a second sub-pixel row, and a pixel electrode of each sub-pixel in the first sub-pixel row and the second sub-pixel row comprises an electrode main body part and an electrode extension part extending from the electrode main body part,
the electrode extension part of each sub-pixel in the first sub-pixel row extends towards the second sub-pixel row substantially along the second direction, and the electrode extension part of each sub-pixel in the second sub-pixel row extends towards the first sub-pixel row substantially along the second direction,
the electrode extension parts of the sub-pixels in the first sub-pixel row and the second sub-pixel row are alternately arranged in the first direction,
the sub-pixel further comprises: a pixel circuit electrically connected to the pixel electrode, the pixel circuit comprises a driving sub-circuit, the driving sub-circuit comprises a control electrode and is configured to control a driving current for driving a light-emitting element corresponding to the sub-pixel according to a voltage on the control electrode, and a via hole through which the electrode extension part of the sub-pixel is electrically connected with the pixel circuit, wherein
in each sub-pixel of the first sub-pixel row, the electrode main body part at least partially overlaps with the control electrode or an electrode part electrically connected to the control electrode, while the electrode extension part does not overlap with the control electrode or the electrode part; and
in each sub-pixel of the second sub-pixel row, the electrode main body part does not overlap with the control electrode or the electrode part, while the electrode extension part at least partially overlaps with the control electrode or the electrode part.

2. The display substrate according to claim 1, wherein in a same sub-pixel row, the sub-pixel, of which the electrode main body part has a largest area or a smallest area, has the electrode extension part with a smallest length or a largest length, respectively.

3. The display substrate according to claim 1, wherein a length of the electrode extension part of each sub-pixel in the first sub-pixel row is smaller than a length of the electrode extension part of each sub-pixel in the second sub-pixel row.

4. The display substrate according to claim 1, wherein the electrode main body part of the pixel electrode of each sub-pixel in the first sub-pixel row is located between the electrode extension parts of the pixel electrodes of two adjacent sub-pixels in the second sub-pixel row.

5. The display substrate according to claim 1, wherein the electrode extension part of the pixel electrode of each sub-pixel in the second sub-pixel row extends to be located between the electrode main body parts of the pixel electrodes of two adjacent sub-pixels in the first sub-pixel row.

6. The display substrate according to claim 1, wherein the control electrode is a gate of a driving transistor.

7. The display substrate according to claim 1, wherein
the via holes of all the sub-pixels in the first sub-pixel row are basically arranged on a first straight line extending along the first direction, and
the via holes of all the sub-pixels in the second sub-pixel row are basically arranged on a second straight line extending along the first direction.

8. The display substrate according to claim 7, wherein the first straight line and the second straight line are substantially coincident with each other.

9. The display substrate according to claim 1, further comprising a pixel defining layer having a plurality of opening regions corresponding to the plurality of sub-pixels, and electrode main body parts of pixel electrodes of the plurality of sub-pixels are exposed through the plurality of opening regions, respectively, wherein
in a same sub-pixel row, a largest distance or a smallest distance between the via hole of the sub-pixel and the corresponding opening region corresponds to a smallest area or a largest area of the electrode main body part of the sub-pixel, and also corresponds to a largest length or a smallest length of the electrode extension part of the sub-pixel.

10. The display substrate according to claim 9, wherein distances between the via holes and the opening regions are different for the plurality of sub-pixels in a same sub-pixel row.

11. The display substrate according to claim 1, wherein an orthographic projection of the electrode extension part of the pixel electrode of each sub-pixel in the first sub-pixel row on the base substrate is located between an orthographic projection of the via hole on the base substrate and an orthographic projection of the control electrode of the pixel circuit of the sub-pixel on the base substrate, in the second direction.

12. The display substrate according to claim 1, wherein an orthographic projection of the via hole of each sub-pixel in the second sub-pixel row on the base substrate is located between an orthographic projection of the electrode main body part of the pixel electrode of the sub-pixel on the base substrate and an orthographic projection of the control electrode of the pixel circuit of the sub-pixel on the base substrate, in the second direction.

13. The display substrate according to claim 1, wherein the first sub-pixel row and the second sub-pixel row comprise a first sub-pixel group and a second sub-pixel group, wherein
the first sub-pixel group comprises a second sub-pixel and a third sub-pixel that are adjacent in the first sub-pixel row as well as a first sub-pixel adjacent to the second sub-pixel and the third sub-pixel in the second sub-pixel row, and
the second sub-pixel group comprises a seventh sub-pixel and an eighth sub-pixel that are adjacent in the second sub-pixel row as well as a sixth sub-pixel adjacent to the seventh sub-pixel and the eighth sub-pixel in the first sub-pixel row; wherein the three sub-pixels of the first sub-pixel group are distributed in a first triangle, the three sub-pixels of the second sub-pixel group are distributed in a second triangle, and the first triangle and the second triangle are inverted relative to each other.

14. The display substrate of claim 13, wherein
the first sub-pixel and the sixth sub-pixel are configured to emit light of a same first color;
the second sub-pixel and the seventh sub-pixel are configured to emit light of a same second color; and
the third sub-pixel and the eighth sub-pixel are configured to emit light of a same third color.

15. The display substrate of claim 14, wherein the first color, the second color and the third color are green color, red color and blue color, respectively.

16. The display substrate according to claim 1, wherein the sub-pixels that are configured to emit light of a same color have electrode main body parts with different shapes.

* * * * *